United States Patent
Kim

(10) Patent No.: US 12,322,853 B2
(45) Date of Patent: Jun. 3, 2025

(54) ANTENNA SYSTEM MOUNTED ON VEHICLE

(71) Applicant: LG ELECTRONICS INC., Seoul (KR)

(72) Inventor: Yongkon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 279 days.

(21) Appl. No.: 17/758,566

(22) PCT Filed: Jan. 13, 2020

(86) PCT No.: PCT/KR2020/000567
§ 371 (c)(1),
(2) Date: Jul. 8, 2022

(87) PCT Pub. No.: WO2021/145465
PCT Pub. Date: Jul. 22, 2021

(65) Prior Publication Data
US 2023/0031896 A1  Feb. 2, 2023

(51) Int. Cl.
*H01Q 1/02* (2006.01)
*H01Q 1/32* (2006.01)
*H01Q 1/38* (2006.01)
*H05K 7/20* (2006.01)

(52) U.S. Cl.
CPC ............ *H01Q 1/02* (2013.01); *H01Q 1/325* (2013.01); *H01Q 1/38* (2013.01); *H05K 7/20854* (2013.01); *H05K 7/20881* (2013.01)

(58) Field of Classification Search
CPC ............ H01Q 1/02; H01Q 1/325; H01Q 1/38; H01Q 1/3275; H01Q 1/42; H05K 7/20854; H05K 7/20336
See application file for complete search history.

(56) References Cited

U.S. PATENT DOCUMENTS

| 10,887,439 B2* | 1/2021 | Kamgaing | H01Q 23/00 |
| 2010/0290190 A1* | 11/2010 | Chester | H05K 7/20281 174/547 |
| 2012/0243463 A1* | 9/2012 | Aguirre | H01Q 21/28 370/316 |
| 2018/0323492 A1* | 11/2018 | Daniel | H01Q 1/1271 |
| 2019/0235586 A1* | 8/2019 | Tani | H01Q 9/42 |
| 2020/0006844 A1 | 1/2020 | Ortigosa | |

(Continued)

FOREIGN PATENT DOCUMENTS

| JP | 2017152810 | 8/2017 |
| KR | 1020060064886 | 6/2006 |

(Continued)

OTHER PUBLICATIONS

PCT International Application No. PCT/KR2020/000567, International Search Report dated Oct. 13, 2020, 3 pages.

*Primary Examiner* — Dimary S Lopez Cruz
*Assistant Examiner* — Austin M Back
(74) *Attorney, Agent, or Firm* — LEE, HONG, DEGERMAN, KANG & WAIMEY

(57) ABSTRACT

An antenna system mounted on a vehicle according to an embodiment may comprise a metal cradle which is arranged in a roof frame of the vehicle so as to form a reception portion region, and a heat sink formed on a rear surface of the antenna system and fixed with the reception portion region.

19 Claims, 25 Drawing Sheets

(56) References Cited

U.S. PATENT DOCUMENTS

2020/0243940 A1* 7/2020 Greenstein .......... H05K 7/20854
2022/0201834 A1* 6/2022 Koike .................. H01Q 1/3275
2022/0352622 A1* 11/2022 Choudhury .......... H01Q 1/3275
2022/0369449 A1* 11/2022 Klein ................. H05K 7/20445

FOREIGN PATENT DOCUMENTS

KR      1020190138687      12/2019
WO         2018194641      10/2018

* cited by examiner

FIG. 9B

Thermal Simulation Results @50°C Ambient

Main PCB

| IC | W/ frame | W/o frame |
|---|---|---|
| Audio Amp | 61.8 | 69.2 |
| Audio DSP | 68.5 | 77.1 |
| Ethernet PHY | 65.9 | 74.6 |
| eMMC | 65.3 | 74.3 |
| PMIC | 63.8 | 72.3 |
| LIN Transceiver | 65.5 | 74.2 |
| AP | 67.2 | 76.8 |
| LPDDR4 | 64.9 | 73.9 |
| Power_LDO | 66.1 | 74.8 |
| Power_LDO | 67.5 | 76.5 |

5G NAD Module

| IC | W/ frame | W/o frame |
|---|---|---|
| PMIC | 68.9 | 79.9 |
| MODEM | 69.1 | 80.3 |
| MCP | 67.5 | 78.8 |
| DCDC_DSDA 5G | 68.0 | 79.1 |
| DCDC_5G | 68.8 | 79.9 |
| Transceiver | 67.4 | 78.6 |
| Transceiver_DSDA | 67.1 | 78.3 |
| LB DRx Module_MIMO2 | 67.4 | 78.6 |
| MHB Drx Module_DSDA MIMO2 | 67.1 | 75.5 |
| 5G n77_MIMO1 | 74.6 | 86.1 |
| 5G n79_MIMO1 | 74.6 | 86.2 |

*FIG. 11*

| Heat sink | | Fin Type | Straight Fin | Cross Fin | Cross Fin + Heat Pipe |
|---|---|---|---|---|---|
| | | Material | Al6061(k_167) | ADC12(k_100) | ADC12(k_100) |
| Component | | Spec. | 25℃(LTE) | 25℃(LTE) | 25℃(LTE) |
| NAD Module | NAD PMIC | 105 | 41.9 | 37.9(4↓) | 37.3(4.6↓) |
| | MODEM | 105 | 42.2 | 38.2(4↓) | 37.5(4.7↓) |
| | MCP | 125 | 40.7 | 36.8(3.9↓) | 36.1(4.6↓) |
| | DCDC | 105 | 46.5 | 42.5(4↓) | 41.8(4.7↓) |
| | DCDC | 105 | 46.5 | 42.7(3.8↓) | 42(4.5↓) |
| | Transceiver | 105 | 43 | 39(4↓) | 38.2(4.8↓) |
| | PAM | 105 | 44.7 | 40.8(3.9↓) | 39.8(4.9↓) |
| | PAM | 105 | 39.6 | 36(3.6↓) | 35.4(4.2↓) |
| Others | DCDC | 150 | 260.4 | 243.1(17.3↓) | 243(17.4↓) |

FIG. 13B

| | Vapor Chamber | Heat pipe |
|---|---|---|
| Picture | VCP1, VCP2 | HP |
| Dimension | 20mm~75mm rectangular | 3~8mm diameter or 0.8~2.2mm |
| Shapes | Flat, rectangular, surface embossing, z-direction bending | Round, flat or bend type |
| Working condition | Z direction (height) is limited<br>High ambient or low air flow<br>Flat, rectangular, surface<br>Power densities are high<br>2 dimension heat spread | Plenty of air flow<br>Normal ambient<br>Nominal power density < 25W/cm2<br>1 dimension heat spread |

ANTENNA SYSTEM MOUNTED ON VEHICLE

CROSS-REFERENCE TO RELATED APPLICATION(S)

This application is the National Stage filing under 35 U.S.C. 371 of International Application No. PCT/KR2020/000567, filed on Jan. 13, 2020, the contents of which are all incorporated by reference herein in its entirety.

TECHNICAL FIELD

The present disclosure relates to an antenna system mounted on a vehicle. One particular implementation relates to an antenna system and a heat dissipation structure for a vehicle having the same.

BACKGROUND ART

Electronic devices may be classified into mobile/portable terminals and stationary terminals according to mobility. In recent years, the electronic devices provide various services by virtue of commercialization of a wireless communication system using an LTE communication technology. In the future, it is expected that a wireless communication system using a 5G communication technology will be commercialized to provide various services. Meanwhile, some of LTE frequency bands may be allocated to provide 5G communication services.

In this regard, the mobile terminal may be configured to provide 5G communication services in various frequency bands. Recently, attempts have been made to provide 5G communication services using a Sub-6 band under a 6 GHz band. In the future, it is also expected to provide 5G communication services by using a millimeter-wave (mm-Wave) band in addition to the Sub-6 band for a faster data rate.

Recently, the necessity of providing such a communication service through a vehicle is increasing. Meanwhile, there is a need for a fifth generation (5G) communication service, which is a next generation communication service, as well as existing communication services such as LTE (Long Term Evolution) and the like in relation to communication services.

Accordingly, broadband antennas operating in both the LTE frequency bands and the 5G Sub6 frequency bands need to be disposed in a vehicle other than an electronic device. However, broadband antennas such as cone antennas have problems in that a vertical profile and a weight increase due to an increase in an overall antenna size, particularly, a height.

In addition, the broadband antennas may be implemented in a three-dimensional structure compared to related art planar antennas. In addition, multiple-input/multi-output (MIMO) should be implemented in an electronic device or vehicle to improve communication reliability and communication capacity. To this end, it is necessary to arrange a plurality of broadband antennas in the electronic device or vehicle.

This causes a problem that any detailed arrangement structure has not been taught to arrange antennas having such a three-dimensional structure in an electronic device or vehicle while maintaining a low interference level among the antennas.

In addition, it is necessary to improve antenna performance while maintaining a low-profile structure in the three-dimensional antenna system. However, in the three-dimensional antenna system, a mechanical structure for fixing the antenna in a vehicle is required while securing a height of an antenna itself. This may cause a problem that the antenna performance should be improved while maintaining the mechanical structure to be equal to or lower than a predetermined height.

In addition, as the antenna system is disposed on or inside a vehicle roof, there is a problem in that temperature is increased by an external light source such as the sun. In addition, internal temperature is increased by heat generated as the antenna system is driven, which may affect the performance of internal components of the antenna system.

DISCLOSURE OF INVENTION

Technical Problem

The present disclosure is directed to solving the aforementioned problems and other drawbacks. The present disclosure also describes a heat dissipation structure that prevents internal temperature of an antenna system mounted in a vehicle from being increased by an external heat source.

The present disclosure further describes a heat dissipation structure that prevents the performance of internal components of an antenna system from being affected due to internal temperature which is increased due to heat generated as the antenna system is driven.

The present disclosure further describes improvement of antenna performance and heat dissipation characteristics of an antenna system while maintaining a height of the antenna system to be a predetermined level or less.

The present disclosure further describes a structure for mounting an antenna system, which is capable of operating in a broad frequency band to support various communication systems, to a vehicle.

The present disclosure further describes implementation of an optimized antenna performance for an antenna system while antenna elements in the antenna system operate in a broad frequency band according to various structures.

Solution to Problem

In order to achieve those aspects and other advantages, there is provided an antenna system mounted on a vehicle that may include a metal cradle disposed inside a roof frame of the vehicle and configured to define a reception portion region, and a heat sink disposed on a rear surface of the antenna system and configured to be fixed to the reception portion region.

In one implementation, the antenna system may further include a circuit board on which antennas or circuit components are disposed.

In one implementation, the heat sink may include a body region having a predetermined length and width and having at least one aperture region. The heat sink may further include a plurality of module fixation portions integrally formed with the body region and configured to be fixed to the metal cradle by screws.

In one implementation, the plurality of module fixation portions may operate as a thermal bridge and may be located at different positions on front and rear ends of the body region.

In one implementation, the antenna system may further include an insulation pad disposed on an upper portion of the antenna system and configured to insulate heat. The antenna system may further include a radome cover disposed on an upper portion of the insulating pad and configured to allow radio waves radiated from a plurality of antennas disposed inside the antenna system to pass therethrough.

In one implementation, the antenna system may further include a light blocking film disposed on an upper portion of the radome cover to block light from being incident to the reception portion region inside the vehicle.

In one implementation, the antenna system may include a first substrate on which at least one antenna is disposed, and a second substrate disposed under the first substrate in parallel to the first substrate.

In one implementation, the antenna system may further include a second heat sink disposed beneath the second substrate to surround the second substrate, and extending up to a lower portion of the first substrate.

In one implementation, the second heat sink may include a horizontal portion interfaced with components disposed on a rear surface of the second substrate through a thermal interface material (TIM), and a first vertical portion extending vertically to the horizontal portion and configured to surround the components.

In one implementation, the second heat sink may further include a first connection portion connected to the first vertical portion and disposed on a lower portion of the second substrate. The second heat sink may further include a second vertical portion extending vertically to the first connection portion to surround components disposed on a rear surface of the first substrate. The second heat sink may further include a second connection portion connected to the second vertical portion and disposed on the lower portion of the first substrate.

In one implementation, the antenna system may further include a first processor configured to process a signal from the at least one antenna, and a second processor disposed on a rear surface of the second substrate and configured to control the first processor.

In one implementation, heat generated by the first processor and heat generated by the second processor may be emitted to a space below the second heat sink by the second heat sink that is in contact with the first substrate and the second substrate.

In one implementation, the antenna system may further include a heat spread layer disposed above the second substrate. The heat spread layer may interface with the first processor through a heat interface material (TIM), and spread heat generated from the second substrate by the second processor so as to prevent the heat from being transferred to the first processor.

In one implementation, the heat sink may include a cross fin having a plurality of metal plates disposed in parallel to one another. Also, the heat sink may further include a heat pipe formed through the fin.

In one implementation, the heat pipe may be formed in a bent shape to correspond to a shape of the metal cradle.

In one implementation, the heat sink may further include a vacuum chamber portion connected to the heat pipe and made of a metal plate having a predetermined width and length.

In one implementation, the vacuum chamber portion may dissipate heat moved in one direction along the heat pipe to an external space of the metal cradle through a corresponding area.

In one implementation, the first processor may control an input power or gain of an amplifier in the first processor so as to reduce an RF output of the amplifier when internal temperature of the metal cradle is equal to or higher than a threshold value.

In one implementation, the second processor may control a fan module, which is disposed inside or outside the metal cradle, to blow air into the metal cradle when internal temperature of the metal cradle is equal to or higher than a threshold value.

According to another aspect of the subject matter disclosed herein, there is provided a vehicle having an antenna assembly. The vehicle may include a metal cradle disposed inside a roof frame of the vehicle and configured to define a reception portion region, and an antenna system disposed in the reception portion region of the metal cradle and including a first substrate and a second substrate disposed under the first substrate. The vehicle may include a first processor disposed on the first substrate or the second substrate and configured to process signals from a plurality of antennas, and a second processor disposed on the second substrate and configured to control the first processor.

In one implementation, the first processor may control the transceiver circuit to receive a first signal of a first frequency band from a first entity through a first antenna disposed on the first substrate or the second substrate. On the other hand, the first processor may control the transceiver circuit to receive a second signal of a second frequency band from a second entity through a second antenna disposed on the same plane as the first antenna. Therefore, the first processor may perform communication with a base station as the first entity and V2V communication with another vehicle as the second entity.

Advantageous Effects of Invention

Hereinafter, technical effects of an antenna system mounted on a vehicle and a vehicle equipped with the antenna system will be described.

According to one implementation, an antenna system having a metal cradle structure can provide a heat dissipation structure that prevents internal temperature from rising due to an external light source.

According to one implementation, an antenna system having a metal cradle structure and a heat sink structure can provide a heat dissipation structure that prevents heat generated during an operation from affecting the performance of internal components.

According to one implementation, antenna performance and heat dissipation performance can be improved while maintaining a height of an antenna system mounted on a vehicle to be lower than or equal to a predetermined height.

According to an implementation, a structure for mounting an antenna system, which can operate in a broad frequency band, to a vehicle can be provided to support various communication systems by implementing a low band (LB) antenna and other antennas in one antenna module.

According to one implementation, the antenna system of the vehicle can implement MIMO and diversity operations using a plurality of antennas in specific bands.

According to one implementation, antennas that can operate in a broad frequency band can be implemented in an optimized arrangement structure, thereby improving antenna efficiency and securing isolation between antennas.

Further scope of applicability of the present disclosure will become apparent from the following detailed description. It should be understood, however, that the detailed description and specific examples, such as the preferred implementation of the invention, are given by way of

BRIEF DESCRIPTION OF DRAWINGS

FIG. 9B is a view illustrating a thermal simulation result inside an antenna system in accordance with one implementation.

FIG. 11 is a view illustrating a simulation result for each component in the heat dissipation structures according to FIGS. 10A to 10C.

FIG. 13B is a view illustrating shapes and operating conditions of a vacuum chamber portion and heat pipe of various structures.

MODE FOR THE INVENTION

Figure 1A:
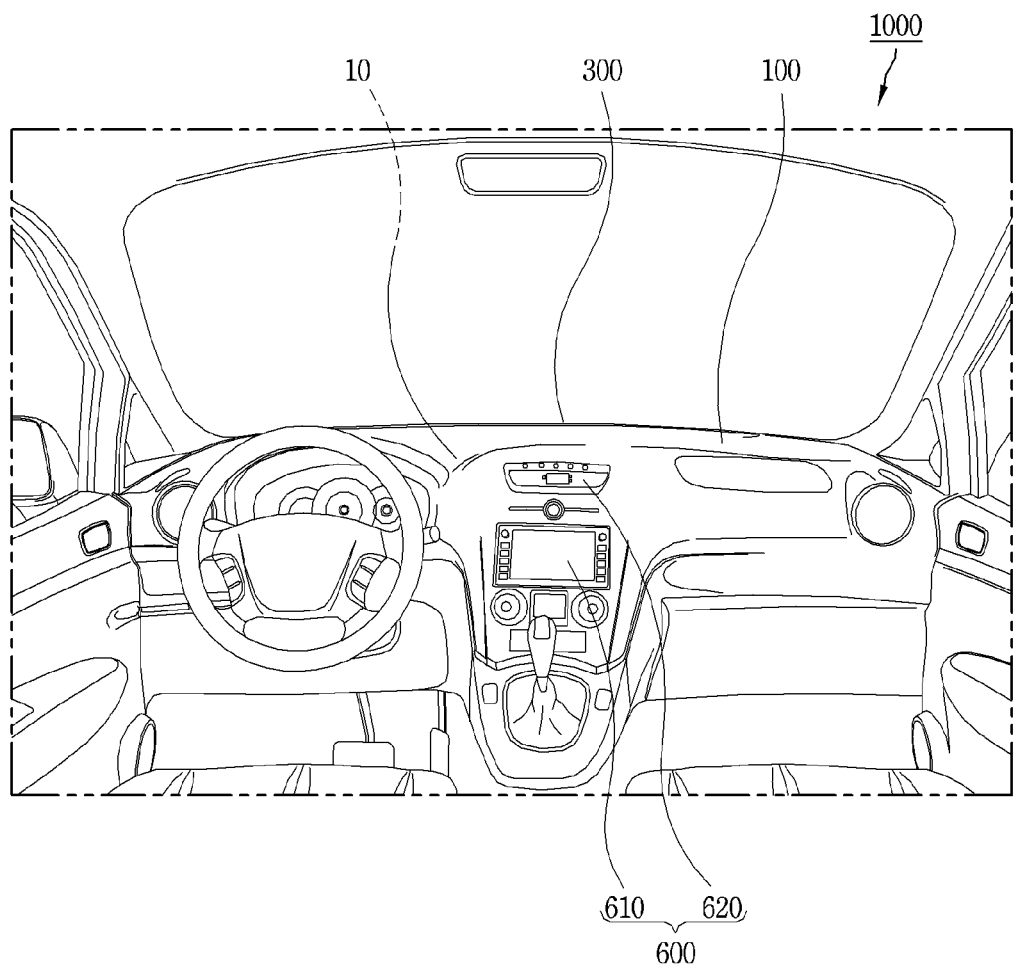
FIG. 1A is a diagram illustrating a vehicle interior in accordance with one example.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Electronic devices presented herein may be implemented using a variety of different types of terminals. Examples of such devices include cellular phones, smart phones, laptop computers, digital broadcasting terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

An electronic device described herein may include a vehicle in addition to a mobile terminal. Therefore, wireless communication through the electronic device described herein may include wireless communication through the vehicle in addition to wireless communication through the mobile terminal.

Configuration and operations according to implementations described herein may also be applied to the vehicle in addition to the mobile terminal. Configurations and operations according to implementations may also be applied to a communication system, namely, antenna system mounted on the vehicle. In this regard, the antenna system mounted on the vehicle may include a plurality of antennas, and a transceiver circuit and a processor for controlling the plurality of antennas.

On the other hand, an antenna system mounted on a vehicle disclosed in this specification mainly refers to an antenna system disposed on an outside of the vehicle, but may also include a mobile terminal (electronic device) belonging to a user aboard the vehicle.

Figure 1B:
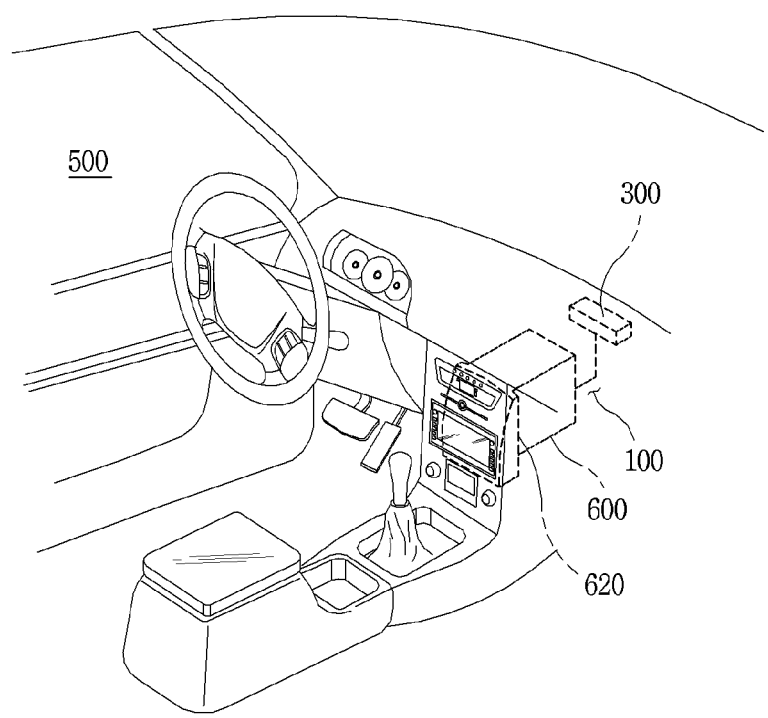
FIG. 1B is a diagram illustrating the vehicle interior in accordance with the one example, viewed from a side.

FIG. 1A is a diagram illustrating a vehicle interior in accordance with one example. FIG. 1B is a diagram illustrating the vehicle interior in accordance with the one example, viewed from a side.

As illustrated in FIGS. 1A and 1B, the present disclosure describes an antenna unit (i.e., an internal antenna system) 300 capable of transmitting and receiving signals through GPS, 4G wireless communication, 5G wireless communication, Bluetooth, or wireless LAN. Therefore, the antenna unit (i.e., the internal antenna system) 300 capable of supporting these various communication protocols may be referred to as an integrated antenna module 300.

The present disclosure also describes a vehicle 500 having the antenna unit (i.e., the internal antenna system) 300. The vehicle 500 may include a housing including a dashboard 100 and an antenna unit 300. In addition, the vehicle 500 may include a mounting bracket for mounting the antenna unit 300.

The vehicle 500 according to the present disclosure may include an antenna module 300 corresponding to an antenna unit (i.e., an internal antenna system) and a telematics module (TCU) 600 configured to be connected to the antenna module 300. In one example, the telematics module 600 may be configured to include the antenna module 300. The telematics module 600 may include a display 610 and an audio unit 620.

<V2X (Vehicle-to-Everything)>

V2X communication may include communications between a vehicle and all entities, such as V2V (Vehicle-to-Vehicle) which refers to communication between vehicles, V2I (Vehicle-to-Infrastructure) which refers to communication between a vehicle and an eNB or RSU (Road Side Unit), V2P (Vehicle-to-Pedestrian) which refers to communication between a vehicle and a terminal possessed by a person (pedestrian, cyclist, vehicle driver, or passenger), V2N (vehicle-to-network), and the like.

V2X communication may indicate the same meaning as V2X sidelink or NR V2X or may indicate a broader meaning including V2X sidelink or NR V2X.

V2X communication can be applied to various services, for example, forward collision warning, automatic parking system, Cooperative Adaptive Cruise Control (CACC), control loss warning, traffic queue warning, traffic vulnerable safety warning, emergency vehicle warning, speed warning when driving on a curved road, traffic flow control, and the like.

V2X communication may be provided through a PC5 interface and/or a Uu interface. In this case, specific network entities for supporting communications between a vehicle and all entities may exist in a wireless communication system supporting V2X communication. For example, the network entity may include a base station (eNB), a Road Side Unit (RSU), a terminal, or an application server (e.g., a traffic safety server).

In addition, a terminal performing V2X communication may refer to not only a general handheld UE but also a vehicle (V-UE), a pedestrian UE, an RSU of an eNB type, an RSU of a UE type, a robot equipped with a communication module, and the like.

V2X communication may be performed directly between terminals or may be performed through the network entity (entities). V2X operation modes may be classified according to a method of performing such V2X communication.

Terms used in V2X communication may be defined as follows.

A Road Side Unit (RSU) is a V2X service enabled device that can transmit and receive data to and from a moving vehicle using V2I service. The RSU is also a stationary infrastructure entity supporting V2X application programs, and can exchange messages with other entities that support V2X application programs. The RSU is a term frequently used in existing ITS specifications, and the reason for introducing this term to the 3GPP specifications is to make the documents easier to read for the ITS industry. The RSU is a logical entity that combines a V2X application logic with the functionality of an eNB (referred to as an eNB-type RSU) or a UE (referred to as a UE-type RSU).

V2I Service is a type of V2X service, where one party is a vehicle whereas the other party is an entity belonging to infrastructure. V2P Service is also a type of V2X service, where one party is a vehicle and the other party is a device carried by an individual (e.g., a handheld terminal carried by a pedestrian, a cyclist, a driver, or a passenger). V2X Service is a type of 3GPP communication service that involves a transmitting or receiving device on a vehicle. Based on the other party involved in the communication, it may be further divided into V2V service, V2I service and V2P service.

V2X enabled UE is a UE that supports V2X service. V2V Service is a type of V2X service, where both parties of communication are vehicles. V2V communication range is a direct communication range between two vehicles engaged in V2V service.

Figure 2A:
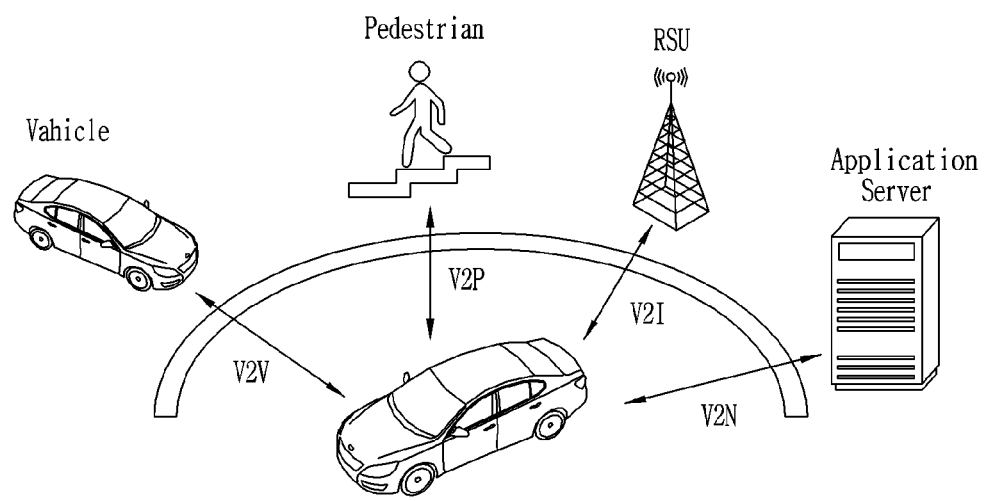
FIG. 2A is a diagram illustrating a type of V2X application.

V2X applications, referred to as Vehicle-to-Everything (V2X), include the four different types, as described above, namely, (1) vehicle-to-vehicle (V2V), (2) vehicle-to-infrastructure (V2I), (3) vehicle-to-network (V2N), (4) vehicle-to-pedestrian (V2P). FIG. 2A illustrates a type of V2X application. Referring to FIG. 2A, the four types of V2X applications may use "cooperative awareness" to provide more intelligent services for end-users.

This means that entities, such as vehicles, roadside infrastructures, application servers and pedestrians, may collect knowledge of their local environments (e.g., information received from other vehicles or sensor equipment in proximity) to process and share that knowledge in order to provide more intelligent services, such as cooperative collision warning or autonomous driving.

<NR V2X>

Support for V2V and V2X services has been introduced in LTE during Releases 14 and 15, in order to expand the 3GPP platform to the automotive industry.

Requirements for support of enhanced V2X use cases are broadly arranged into four use case groups.

(1) Vehicles Platooning enables the vehicles to dynamically form a platoon traveling together. All the vehicles in the platoon obtain information from the leading vehicle to manage this platoon. These information allow the vehicles to drive closer than normal in a coordinated manner, going to the same direction and traveling together.

(2) Extended Sensors enable the exchange of raw or processed data gathered through local sensors or live video images among vehicles, road site units, devices of pedestrians and V2X application servers. The vehicles can increase the perception of their environment beyond of what their own sensors can detect and have a more broad and holistic view of the local situation. High data rate is one of the key characteristics.

(3) Advanced Driving enables semi-automated or full-automated driving. Each vehicle and/or RSU shares its own perception data obtained from its local sensors with vehicles in proximity and allows vehicles to synchronize and coordinate their trajectories or maneuvers. Each vehicle shares its driving intention with vehicles in proximity too.

(4) Remote Driving enables a remote driver or a V2X application to operate a remote vehicle for those passengers who cannot drive by themselves or remote vehicles located in dangerous environments. For a case where variation is limited and routes are predictable, such as in public transportation, driving based on cloud computing can be used. High reliability and low latency are the main requirements.

A description to be given below can be applied to all of NR SL (sidelink) and LTE SL, and when no radio access technology (RAT) is indicated, the NR SL is meant. Operation scenarios considered in NR V2X may be categorized into six as follows. In this regard, FIG. 2B illustrates a standalone scenario supporting V2X SL communication and an MR-DC scenario supporting V2X SL communication.

In particular, 1) in scenario 1, a gNB provides control/configuration for a UE's V2X communication in both LTE SL and NR SL. 2) In scenario 2, an ng-eNB provides control/configuration for a UE's V2X communication in both LTE SL and NR SL. 3) In scenario 3, an eNB provides control/configuration for a UE's V2X communication in both LTE SL and NR SL. On the other hand, 4) in scenario 4, a UE's V2X communication in LTE SL and NR SL is controlled/configured by Uu while the UE is configured with EN-DC. 5) In scenario 5, a UE's V2X communication in LTE SL and NR SL is controlled/configured by Uu while the UE is configured in NE-DC. 6) In scenario 6, a UE's V2X communication in LTE SL and NR SL is controlled/configured by Uu while the UE is configured in NGEN-DC.

Figure 2B:
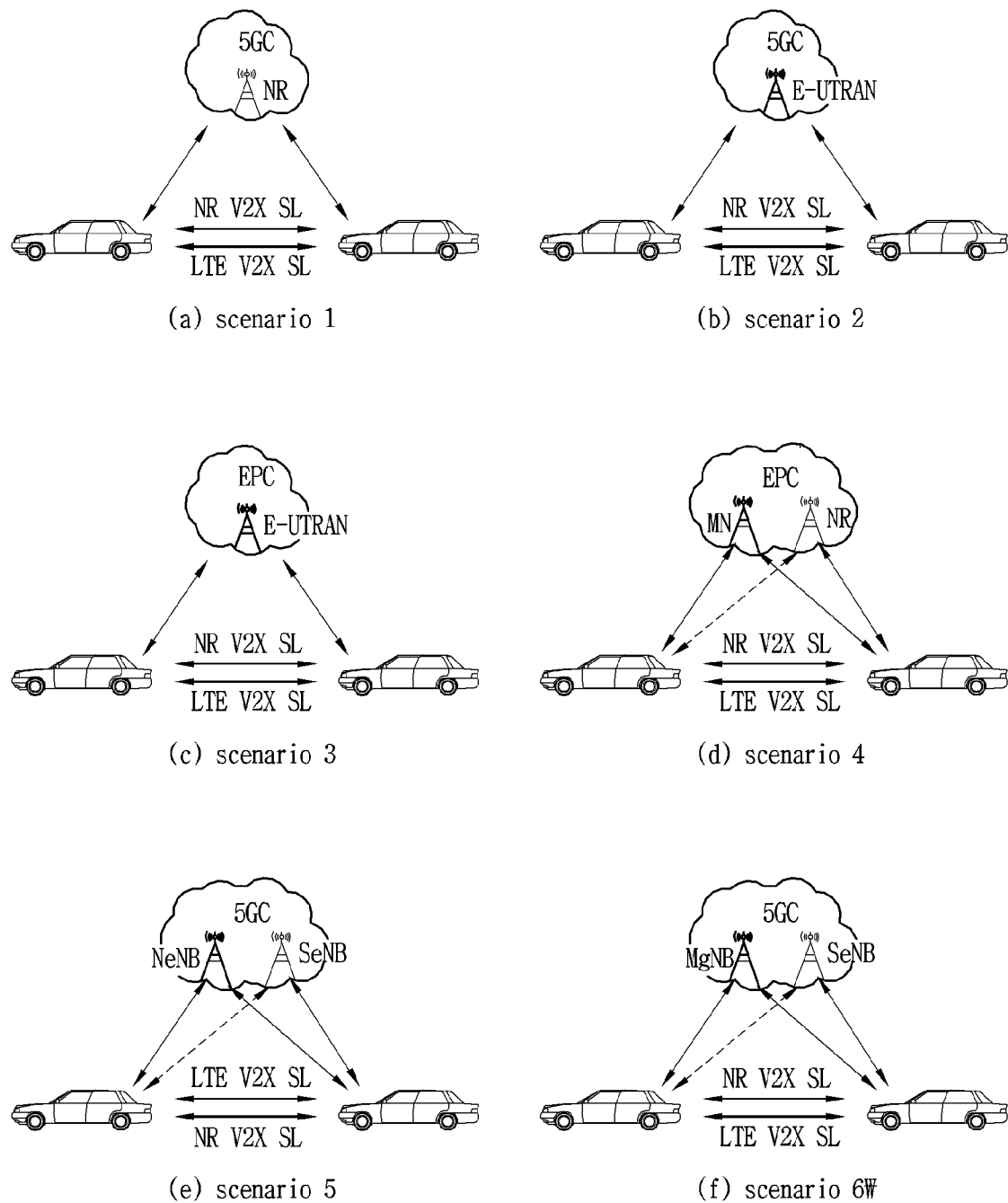
FIG. 2B illustrates a standalone scenario supporting V2X SL communication and an MR-DC scenario supporting V2X SL communication.

In order to support V2X communication, as illustrated in FIGS. 2A and 2B, a vehicle may perform wireless communication with an eNB and/or a gNB through an antenna system.

Figure 3A:
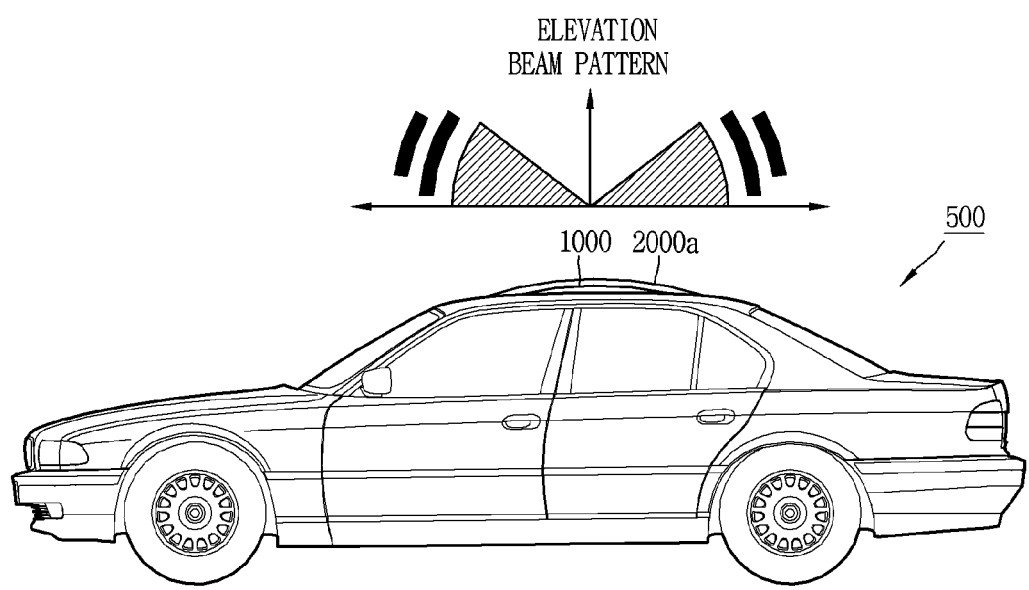
FIGS. 3A to 3C are views illustrating an example of a structure for mounting an antenna system in a vehicle, which includes the antenna system mounted in the vehicle.
Figure 3B:
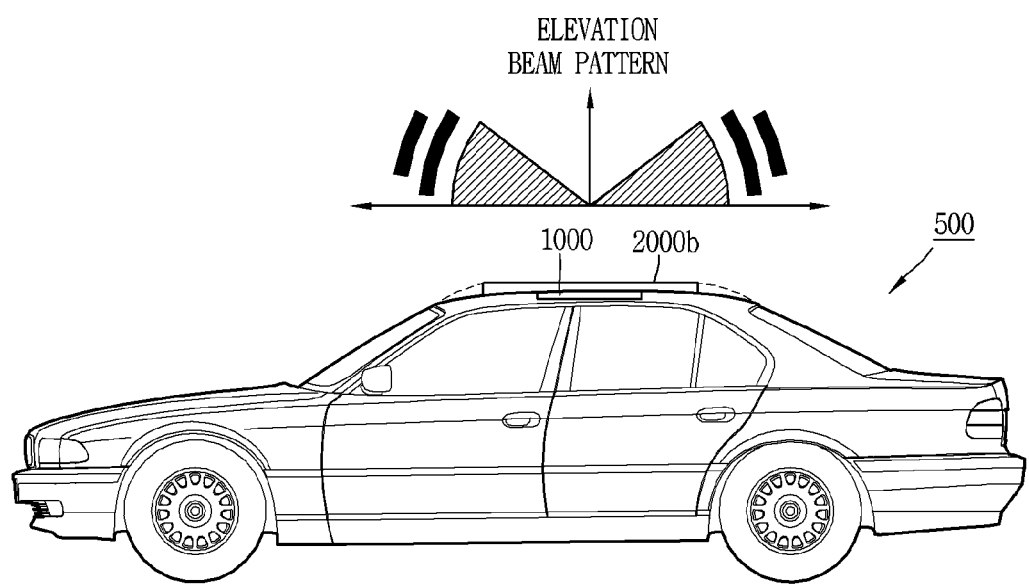
Figure 3C:
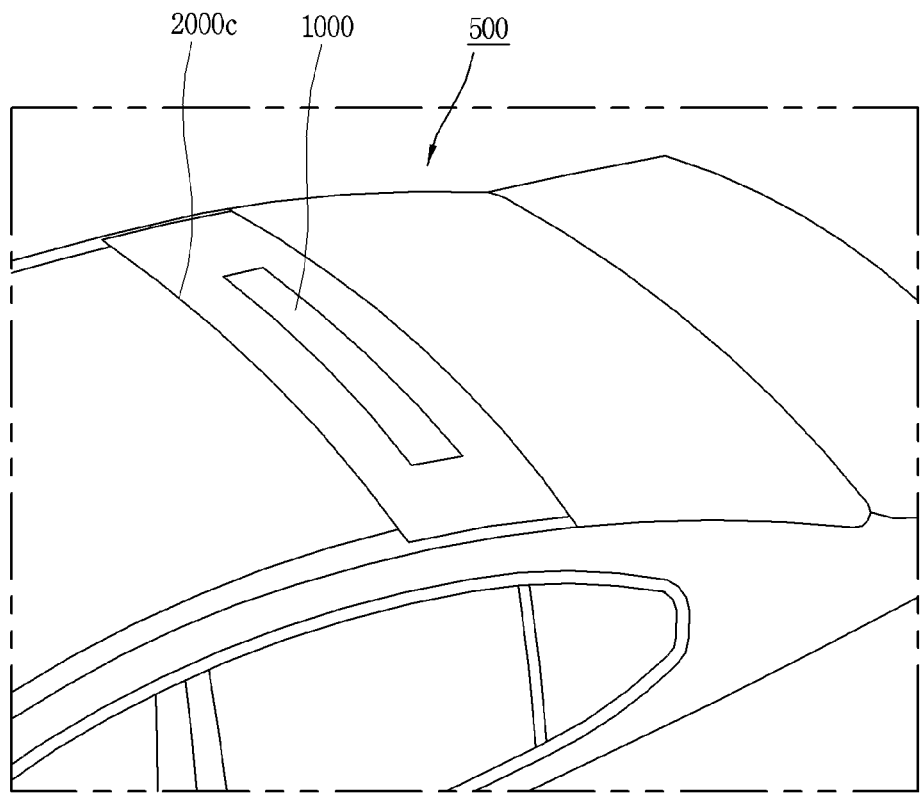

FIGS. 3A to 3C are views illustrating an example of a structure for mounting an antenna system in a vehicle, which includes the antenna system mounted in the vehicle. In this regard, FIGS. 3A and 3B illustrate a configuration in which an antenna system 1000 is mounted on or in a roof of a vehicle. Meanwhile, FIG. 3C illustrates a structure in which the antenna system 1000 is mounted on a roof of the vehicle and a roof frame of a rear mirror.

Referring to FIGS. 3A to 3C, in order to improve the appearance of the vehicle and to maintain a telematics performance at the time of collision, an existing shark fin antenna is replaced with a flat antenna of a non-protruding shape. In addition, the present disclosure proposes an integrated antenna of an LTE antenna and a 5G antenna considering fifth generation (5G) communication while providing the existing mobile communication service (e.g., LTE).

Referring to FIG. 3A, the antenna system 1000 may be disposed on the roof of the vehicle. In FIG. 3A, a radome 2000a for protecting the antenna system 1000 from an external environment and external impacts while the vehicle travels may cover the antenna system 1000. The radome 2000a may be made of a dielectric material through which radio signals are transmitted/received between the antenna system 1000 and a base station.

Referring to FIG. 3B, the antenna system 1000 may be disposed within a roof structure 2000b of the vehicle, and at least part of the roof structure 2000b may be made of a non-metallic material. At this time, the at least part of the roof structure 2000b of the vehicle may be realized as the non-metallic material, and may be made of a dielectric material through which radio signals are transmitted/received between the antenna system 1000 and the base station.

Also, referring to 3C, the antenna system 1000 may be disposed within a roof frame 2000c of the vehicle, and at least part of the roof frame 200c may be made of a non-metallic material. At this time, the at least part of the roof frame 2000c of the vehicle 500 may be realized as the non-metallic material, and may be made of a dielectric material through which radio signals are transmitted/received between the antenna system 1000 and the base station.

Meanwhile, referring to FIGS. 3A to 3C, a beam pattern by an antenna disposed in the antenna system 1000 mounted on the vehicle needs to be formed at an upper side by a predetermined angle in a horizontal region.

In this regard, the peak of an elevation beam pattern of the antenna disposed in the antenna system 1000 does not need to be formed at a bore site. Accordingly, the peak of the elevation beam pattern of the antenna needs to be formed at the upper side by the predetermined angle in the horizontal region. For example, the elevation beam pattern of the antenna may be formed in a hemispheric shape as illustrated in FIGS. 2A to 2C.

As aforementioned, the antenna system 1000 may be installed on the front or rear surface of the vehicle depending on applications, other than the roof structure or roof frame of the vehicle. In this regard, the antenna system 1000 may correspond to an external antenna.

Meanwhile, the vehicle 500 may include only an antenna unit (i.e., internal antenna system) 300 corresponding to an internal antenna without an antenna system 1000 corresponding to an external antenna. In addition, the vehicle 500 may include both the antenna system 1000 corresponding to the external antenna and the antenna unit (i.e., the internal antenna system) 300 corresponding to the internal antenna.

Figure 4A:
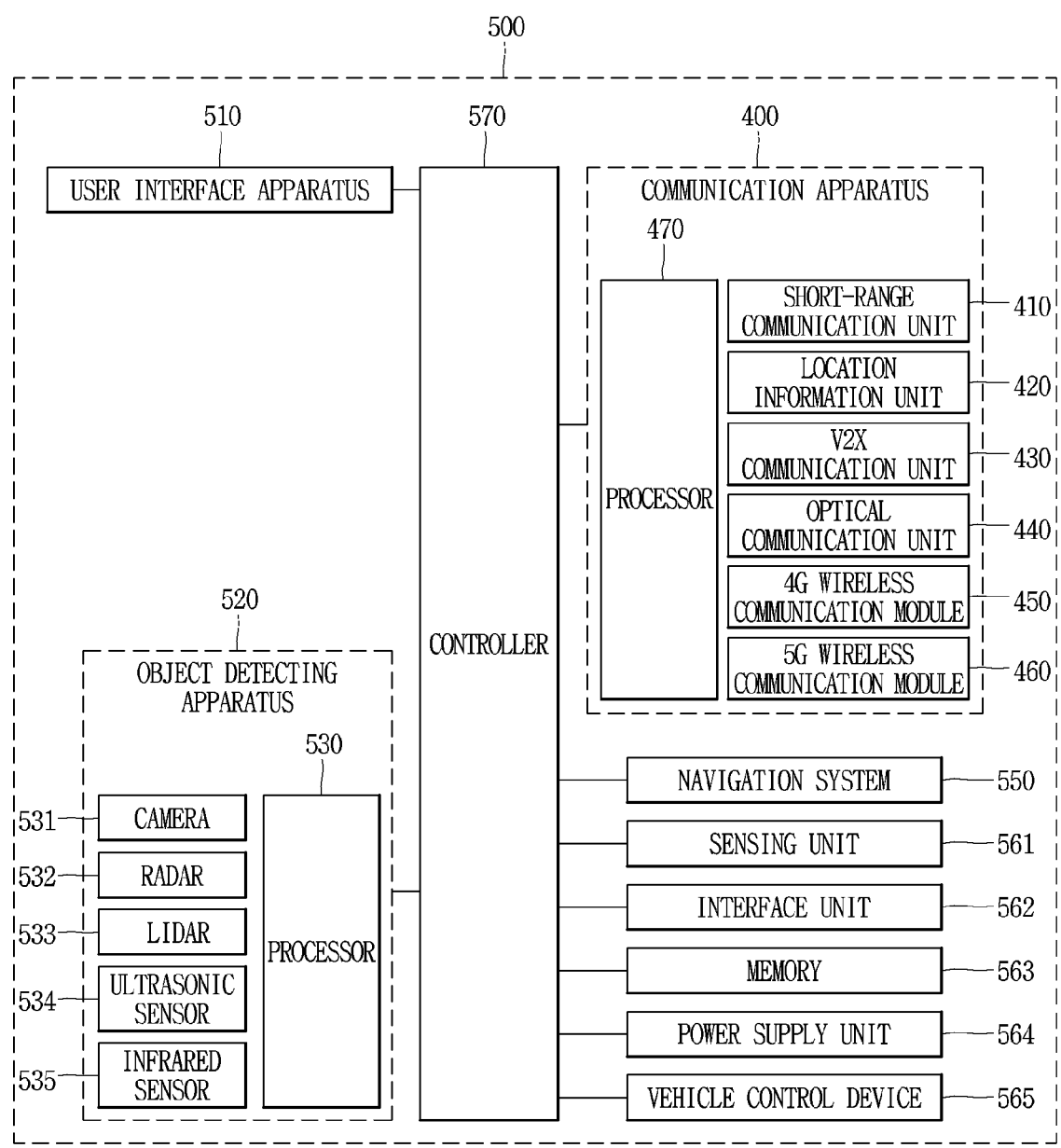
FIG. 4A is a block diagram illustrating a vehicle and an antenna system mounted to the vehicle in accordance with one implementation.

FIG. 4 is a block diagram illustrating a vehicle and an antenna system mounted on the vehicle in accordance with an implementation.

The vehicle 500 may be an autonomous vehicle. The vehicle 500 may be switched into an autonomous driving mode or a manual mode (a pseudo driving mode) based on a user input. For example, the vehicle 500 may be switched from the manual mode into the autonomous mode or from the autonomous mode into the manual mode based on a user input received through a user interface apparatus 510.

In relation to the manual mode and the autonomous driving mode, operations such as object detection, wireless communication, navigation, and operations of vehicle sensors and interfaces may be performed by the telematics module mounted on the vehicle 500. Specifically, the telematics module mounted on the vehicle 500 may perform the operations in cooperation with the antenna module 300, the object detecting apparatus 520, and other interfaces. In some examples, the communication apparatus 400 may be disposed in the telematics module separately from the antenna system 300 or may be disposed in the antenna system 300.

The vehicle 500 may be switched into the autonomous driving mode or the manual mode based on driving environment information. The driving environment information may be generated based on object information provided from the object detecting apparatus 520. For example, the vehicle 500 may be switched from the manual mode into the autonomous driving mode or from the autonomous driving mode into the manual mode based on driving environment information generated in the object detecting apparatus 520.

For example, the vehicle 500 may be switched from the manual mode into the autonomous driving mode or from the autonomous driving mode into the manual mode based on driving environment information received through the communication apparatus 400. The vehicle 500 may be switched from the manual mode into the autonomous driving mode or from the autonomous driving mode into the manual mode based on information, data or signal provided from an external device.

When the vehicle 500 is driven in the autonomous driving mode, the autonomous vehicle 500 may be driven based on an operation system. For example, the autonomous vehicle 500 may be driven based on information, data or signal generated in a driving system, a parking exit system, and a parking system. When the vehicle 500 is driven in the manual mode, the autonomous vehicle 500 may receive a user input for driving through a driving control apparatus. The vehicle 500 may be driven based on the user input received through the driving control apparatus.

The vehicle 500 may include a user interface apparatus 510, an object detecting apparatus 520, a navigation system 550, and a communication apparatus 400. In addition, the vehicle may further include a sensing unit 561, an interface unit 562, a memory 563, a power supply unit 564, and a vehicle control device 565 in addition to the aforementioned apparatuses and devices. In some implementations, the vehicle 500 may include more components in addition to components to be explained in this specification or may not include some of those components to be explained in this specification.

The user interface apparatus 510 may be an apparatus for communication between the vehicle 500 and a user. The user interface apparatus 510 may receive a user input and provide information generated in the vehicle 500 to the user. The vehicle 500 may implement user interfaces (UIs) or user experiences (UXs) through the user interface apparatus 200.

The object detecting apparatus 520 may be an apparatus for detecting an object located at outside of the vehicle 500. The object may be a variety of objects associated with driving (operation) of the vehicle 500. In some examples, objects may be classified into moving objects and fixed (stationary) objects. For example, the moving objects may include other vehicles and pedestrians. The fixed objects may include traffic signals, roads, and structures, for example. The object detecting apparatus 520 may include a camera 531, a radar 532, a LiDAR 533, an ultrasonic sensor 534, an infrared sensor 535, and a processor 530. In some implementations, the object detecting apparatus 520 may further include other components in addition to the components described, or may not include some of the components described.

The processor 530 may control an overall operation of each unit of the object detecting apparatus 520. The processor 530 may detect an object based on an acquired image, and track the object. The processor 530 may execute operations, such as a calculation of a distance from the object, a calculation of a relative speed with the object and the like, through an image processing algorithm.

In some implementations, the object detecting apparatus 520 may include a plurality of processors 530 or may not include any processor 530. For example, each of the camera 521, the radar 522, the LiDAR 523, the ultrasonic sensor 524 and the infrared sensor 525 may include the processor in an individual manner.

When the processor 530 is not included in the object detecting apparatus 520, the object detecting apparatus 520 may operate according to the control of a processor of an apparatus within the vehicle 500 or the controller 570.

The navigation system 550 may provide location information related to the vehicle based on information obtained through the communication apparatus 400, in particular, a location information unit 420. Also, the navigation system 550 may provide a path (or route) guidance service to a destination based on current location information related to the vehicle. In addition, the navigation system 550 may provide guidance information related to surroundings of the vehicle based on information obtained through the object detecting apparatus 520 and/or a V2X communication unit 430. In some examples, guidance information, autonomous driving service, etc. may be provided based on V2V, V2I, and V2X information obtained through a wireless communication unit operating together with the antenna system 1000.

The communication apparatus 400 may be an apparatus for performing communication with an external device. Here, the external device may be another vehicle, a mobile terminal, or a server. The communication apparatus 400 may perform the communication by including at least one of a transmitting antenna, a receiving antenna, and radio frequency (RF) circuit and RF device for implementing various communication protocols. The communication apparatus 400 may include a short-range communication unit 410, a location information unit 420, a V2X communication unit 430, an optical communication unit 440, a broadcast transceiver 450 and a processor 470. According to an implementation, the communication apparatus 400 may further include other components in addition to the components described, or may not include some of the components described.

The short-range communication unit 410 is a unit for facilitating short-range communications. The short-range communication unit 410 may construct short-range wireless area networks to perform short-range communication between the vehicle 500 and at least one external device. The location information unit 420 may be a unit for acquiring location information related to the vehicle 500. For example, the location information unit 420 may include a Global Positioning System (GPS) module or a Differential Global Positioning System (DGPS) module.

The V2X communication unit 430 may be a unit for performing wireless communication with a server (Vehicle to Infrastructure; V2I), another vehicle (Vehicle to Vehicle;

V2V), or a pedestrian (Vehicle to Pedestrian; V2P). The V2X communication unit 430 may include an RF circuit implementing communication protocols such as V2I, V2V, and V2P. The optical communication unit 440 may be a unit for performing communication with an external device through the medium of light. The optical communication unit 440 may include a light-emitting diode for converting an electric signal into an optical signal and sending the optical signal to the exterior, and a photodiode for converting the received optical signal into an electric signal. In some implementations, the light-emitting diode may be integrated with lamps provided on the vehicle 500.

The wireless communication unit 460 is a unit that performs wireless communications with one or more communication systems through one or more antenna systems. The wireless communication unit 460 may transmit and/or receive a signal to and/or from a device in a first communication system through a first antenna system. In addition, the wireless communication unit 460 may transmit and/or receive a signal to and/or from a device in a second communication system through a second antenna system. For example, the first communication system and the second communication system may be an LTE communication system and a 5G communication system, respectively. However, the first communication system and the second communication system may not be limited thereto, and may be changed according to applications.

In some examples, the antenna module 300 disposed in the vehicle 500 may include a wireless communication unit. In this regard, the vehicle 500 may be an electric vehicle (EV) or a vehicle that can be connected to a communication system independently of an external electronic device. In this regard, the communication apparatus 400 may include at least one of the short-range communication unit 410, the location information unit 420, the V2X communication unit 430, the optical communication unit 440, a 4G wireless communication module 450, and a 5G wireless communication module 460.

The 4G wireless communication module 450 may perform transmission and reception of 4G signals with a 4G base station through a 4G mobile communication network. In this case, the 4G wireless communication module 450 may transmit at least one 4G transmission signal to the 4G base station. In addition, the 4G wireless communication module 450 may receive at least one 4G reception signal from the 4G base station. In this regard, Uplink (UL) Multi-input and Multi-output (MIMO) may be performed by a plurality of 4G transmission signals transmitted to the 4G base station. In addition, Downlink (DL) MIMO may be performed by a plurality of 4G reception signals received from the 4G base station.

The 5G wireless communication module 460 may perform transmission and reception of 5G signals with a 5G base station through a 5G mobile communication network. Here, the 4G base station and the 5G base station may have a Non-Stand-Alone (NSA) structure. The 4G base station and the 5G base station may be disposed in the Non-Stand-Alone (NSA) structure. Alternatively, the 5G base station may be disposed in a Stand-Alone (SA) structure at a separate location from the 4G base station. The 5G wireless communication module 460 may perform transmission and reception of 5G signals with a 5G base station through a 5G mobile communication network. In this case, the 5G wireless communication module 460 may transmit at least one 5G transmission signal to the 5G base station. In addition, the 5G wireless communication module 460 may receive at least one 5G reception signal from the 5G base station. In this instance, 5G and 4G networks may use the same frequency band, and this may be referred to as LTE re-farming. In some examples, a Sub 6 frequency band, which is a range of 6 GHz or less, may be used as the 5G frequency band. On the other hand, a millimeter-wave (mmWave) range may be used as the 5G frequency band to perform wideband high-speed communication. When the mmWave band is used, the electronic device 100 may perform beamforming for communication coverage expansion with a base station.

On the other hand, regardless of the 5G frequency band, 5G communication systems can support a larger number of multi-input multi-output (MIMO) to improve a transmission rate. In this instance, UL MIMO may be performed by a plurality of 5G transmission signals transmitted to a 5G base station. In addition, DL MIMO may be performed by a plurality of 5G reception signals received from the 5G base station.

In some examples, the wireless communication unit 110 may be in a Dual Connectivity (DC) state with the 4G base station and the 5G base station through the 4G wireless communication module 450 and the 5G wireless communication module 460. As such, the dual connectivity with the 4G base station and the 5G base station may be referred to as EUTRAN NR DC (EN-DC). On the other hand, if the 4G base station and 5G base station are disposed in a co-located structure, throughput improvement can be achieved by inter-Carrier Aggregation (inter-CA). Accordingly, when the 4G base station and the 5G base station are disposed in the EN-DC state, the 4G reception signal and the 5G reception signal may be simultaneously received through the 4G wireless communication module 450 and the 5G wireless communication module 460. Short-range communication between electronic devices (e.g., vehicles) may be performed using the 4G wireless communication module 450 and the 5G wireless communication module 460. In some implementations, after resources are allocated, vehicles may perform wireless communication in a V2V manner without a base station.

Meanwhile, for transmission rate improvement and communication system convergence, Carrier Aggregation (CA) may be carried out using at least one of the 4G wireless communication module 450 and the 5G wireless communication module 460 and a WiFi communication module. In this regard, 4G+WiFi CA may be performed using the 4G wireless communication module 450 and the Wi-Fi communication module. Or, 5G+WiFi CA may be performed using the 5G wireless communication module 460 and the Wi-Fi communication module 113.

Meanwhile, the communication apparatus 400 may implement a display apparatus for a vehicle together with the user interface apparatus 510. In this instance, the display apparatus for the vehicle may be referred to as a telematics apparatus or an Audio Video Navigation (AVN) apparatus.

Figure 4B:
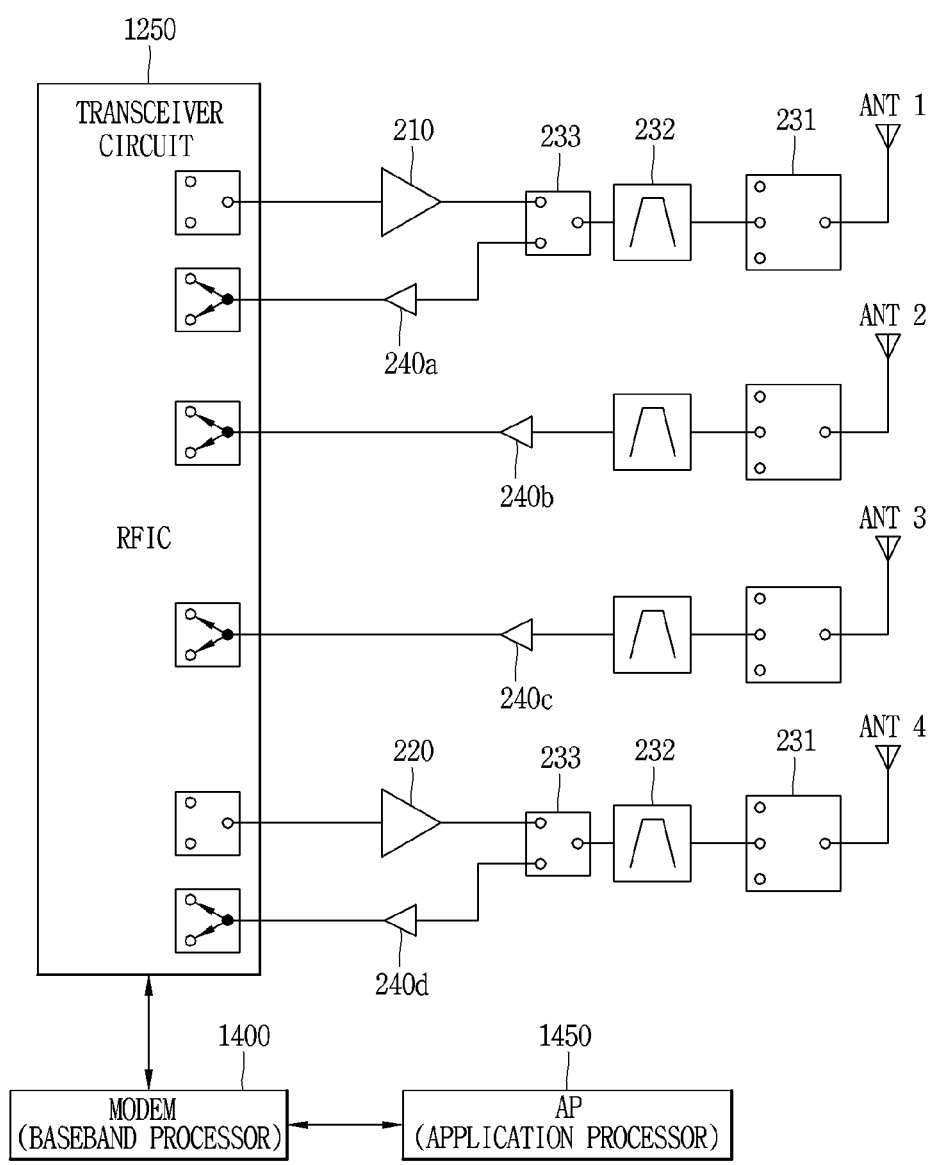
FIG. 4B is a block diagram illustrating an exemplary configuration of a wireless communication unit of a vehicle that can operate in a plurality of wireless communication systems.

FIG. 4B is a block diagram illustrating an exemplary configuration of a wireless communication unit of a vehicle that can operate in a plurality of wireless communication systems. Referring to FIG. 4B, the vehicle may include a first power amplifier 210, a second power amplifier 220, and an RFIC 1250. In addition, the vehicle may further include a modem 1400 and an application processor (AP) 1450. Here, the modem 1400 and the application processor (AP) 1450 may be physically implemented on a single chip, and may be implemented in a logically and functionally separated form. However, the present disclosure may not be limited thereto and may be implemented in the form of a chip that is physically separated according to an application.

Meanwhile, the vehicle may include a plurality of low noise amplifiers (LNAs) 210a to 240a in the receiver. Here, the first power amplifier 210, the second power amplifier 220, the RFIC 1250, and the plurality of low noise amplifiers 210a to 40a may all be operable in the first communication system and the second communication system. In this case, the first communication system and the second communication system may be a 4G communication system and a 5G communication system, respectively.

As illustrated in FIG. 4, the RFIC 1250 may be configured as a 4G/5G integrated type, but the present disclosure may not be limited thereto. The RFIC 250 may be configured as a 4G/5G separate type according to an application. When the RFIC 1250 is configured as the 4G/5G integrated type, it may be advantageous in terms of synchronization between 4G and 5G circuits, and simplification of control signaling by the modem 1400.

On the other hand, when the RFIC 1250 is configured as the 4G/5G separate type, it may be referred to as a 4G RFIC and a 5G RFIC, respectively. In particular, when there is a great band difference between the 5G band and the 4G band, such as when the 5G band is configured as a millimeter wave band, the RFIC 1250 may be configured as a 4G/5G separated type. Meanwhile, even when the RFIC 1250 is configured as the 4G/5G separate type, the 4G RFIC and the 5G RFIC may be logically and functionally separated but physically implemented in one chip as SoC (System on Chip). On the other hand, the application processor (AP) 1450 may be configured to control the operation of each component of the electronic device. Specifically, the application processor (AP) 1450 may control the operation of each component of the electronic device through the modem 1400.

Meanwhile, the first power amplifier 210 and the second power amplifier 220 may operate in at least one of the first and second communication systems. In this regard, when the 5G communication system operates in a 4G band or a Sub 6 band, the first and second power amplifiers 1210 and 220 can operate in both the first and second communication systems. On the other hand, when the 5G communication system operates in a millimeter wave (mmWave) band, one of the first and second power amplifiers 210 and 220 may operate in the 4G band and the other in the millimeter-wave band.

On the other hand, two different wireless communication systems may be implemented in one antenna by integrating a transceiver and a receiver to implement a two-way antenna. In this case, 4×4 MIMO may be implemented using four antennas as illustrated in FIG. 2. At this time, 4×4 DL MIMO may be performed through downlink (DL).

Meanwhile, when the 5G band is a Sub 6 band, first to fourth antennas ANT1 to ANT4 may be configured to operate in both the 4G band and the 5G band. On the contrary, when the 5G band is the millimeter wave (mmWave) band, first to fourth antennas ANT1 to ANT4 may be configured to operate in either one of the 4G band and the 5G band. In this case, when the 5G band is the millimeter wave (mmWave) band, each of the plurality of antennas may be configured as an array antenna in the millimeter wave band. Meanwhile, 2×2 MIMO may be implemented using two antennas connected to the first power amplifier 210 and the second power amplifier 220 among the four antennas. At this time, 2×2 UL MIMO (2 Tx) may be performed through uplink (UL).

In addition, the vehicle that is operable in the plurality of wireless communication systems according to an implementation may further include a duplexer 231, a filter 232, and a switch 233. The duplexer 231 may be configured to separate a signal in a transmission band and a signal in a reception band from each other. In this case, the signal in the transmission band transmitted through the first and second power amplifiers 210 and 220 may be applied to the antennas ANT1 and ANT4 through a first output port of the duplexer 231. On the contrary, the signal in the reception band received through the antennas ANT1 and ANT4 may be received by the low noise amplifiers 310 and 340 through a second output port of the duplexer 231. The filter 232 may be configured to pass a signal in a transmission band or a reception band and to block a signal in a remaining band. The switch 233 may be configured to transmit only one of a transmission signal and a reception signal.

Meanwhile, the vehicle according to the present disclosure may further include a modem 1400 corresponding to the controller. In this case, the RFIC 1250 and the modem 1400 may be referred to as a first controller (or a first processor) and a second controller (a second processor), respectively. On the other hand, the RFIC 1250 and the modem 1400 may be implemented as physically separated circuits. Alternatively, the RFIC 1250 and the modem 1400 may be logically or functionally distinguished from each other on one physical circuit. The modem 1400 may perform controlling of signal transmission and reception and processing of signals through different communication systems using the RFID 1250. The modem 1400 may acquire control information from a 4G base station and/or a 5G base station. Here, the control information may be received through a physical downlink control channel (PDCCH), but may not be limited thereto.

The modem 1400 may control the RFIC 1250 to transmit and/or receive signals through the first communication system and/or the second communication system at a specific time and frequency resources. Accordingly, the vehicle can be allocated resources or maintain a connected state through the eNB or gNB. In addition, the vehicle may perform at least one of V2V communication, V2I communication, and V2P communication with other entities through the allocated resources.

Figure 5A:
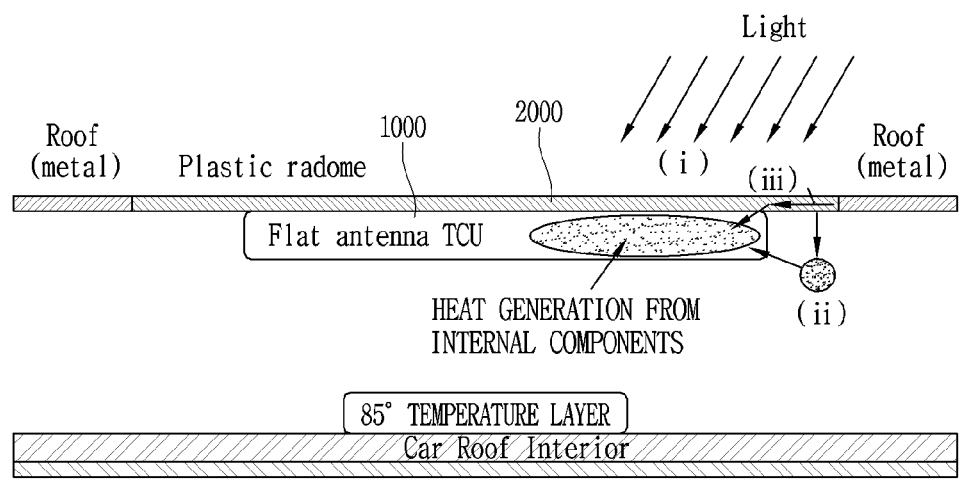
FIG. 5A is a view illustrating an arrangement structure of an antenna system in accordance with one implementation.

Meanwhile, referring to FIGS. 1A to 4B, the antenna system mounted on the vehicle may be disposed on the roof of the vehicle, inside the roof, or inside the roof frame. FIG. 5A is a view illustrating an arrangement structure of an antenna system in accordance with one implementation and FIG. 5B is a view illustrating an internal structure in a height direction of the antenna system including a plurality of antennas in the structure of FIG. 5A.

Figure 5B:
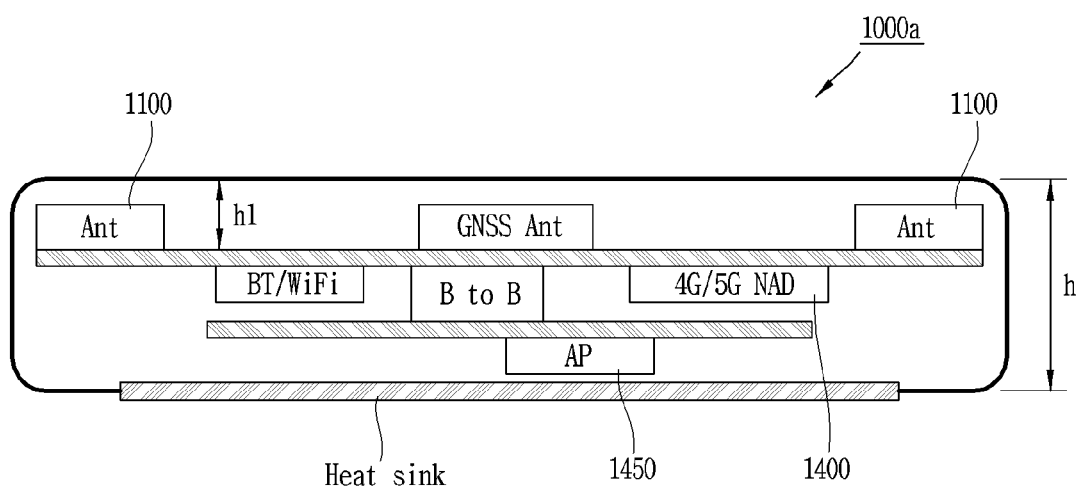
FIG. 5B is a view illustrating an internal structure in a height direction of the antenna system including a plurality of antennas in the structure of FIG. 5A.

As illustrated in FIGS. 5A and 5B, the antenna system 1000 may be disposed inside a radome 2000. Meanwhile, a vehicle roof made of a metal or an internal structure of the vehicle roof may be disposed beneath the antenna system 1000. That is, the TCU having a flat antenna structure may be directly mounted on a plastic cover of the vehicle roof.

In this regard, a plurality of antennas 1100 may be disposed on an upper portion of a circuit board, and a 4G/5G network access device (NAD) 1400 may be disposed on a lower portion of the circuit board. Also, an application processor (AP) 1450 may be disposed on a lower portion of another circuit board. In this structure, the height of the plurality of antennas 1100 may be limited to h1 in the antenna system 1000a having an overall height h.

As the antenna system 1000 is disposed on or inside the vehicle roof, temperature may be increased by an external light source such as the sun. In addition, internal temperature may be increased by heat generated as the antenna system is driven, which may affect the performance of internal components of the antenna system. In this regard, LTE Cat16

NAD may be employed to constitute a heat dissipation structure which enables an operation even when air temperature inside the vehicle roof is at a peak of 105 degrees. For this, it may be possible to utilize both conditions of improving heat dissipation inside the antenna module and reducing an introduction of external heat.

As an example, it is desired to enable a TCU operation even at a peak air temperature of 105 degrees within the roof. In this regard, it may be necessary to keep the temperature of main components inside the antenna system below critical operating temperature. To this end, heat generated in the antenna system may be caused by an external light source (heat source) such as the sun (i). In addition, heat may be generated by heat generation of internal components of the antenna system. Heat may also be conducted from air inside the roof (ii) or may be introduced through a portion made of the plastic material in a vehicle roof region (iii). In this case, the heat may be transferred most to the flat antenna TCU through the plastic portion of the vehicle roof. On the other hand, an air layer with a relative low temperature of 85 degrees may exist below the TCU with the flat antenna structure.

Figure 6A:
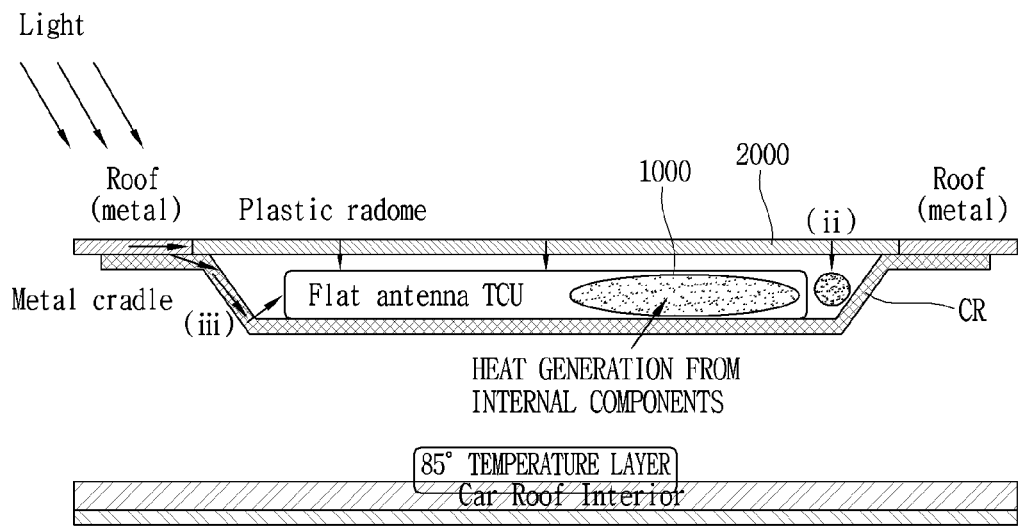
FIG. 6A is a view illustrating an arrangement structure of an antenna system in accordance with another implementation.
Figure 6B:
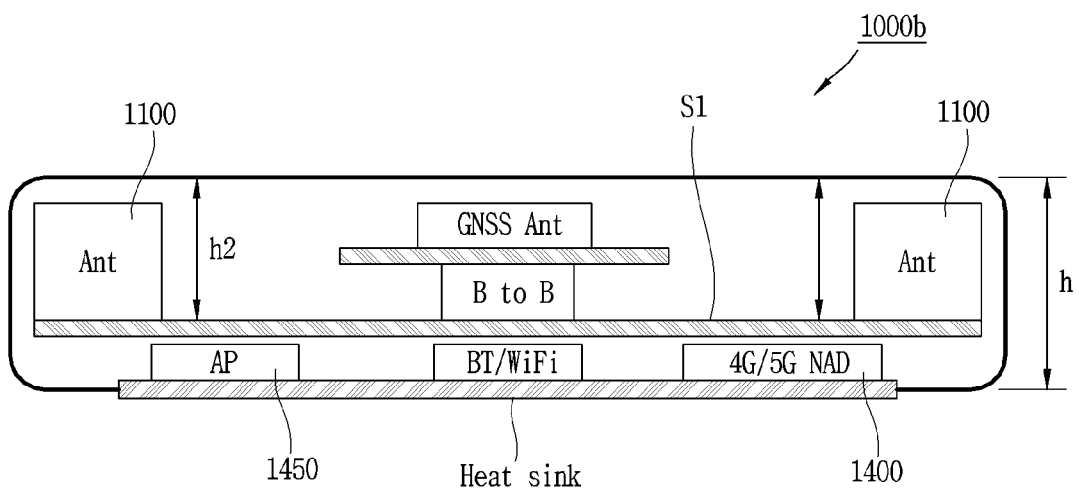
FIG. 6B is a view illustrating an internal structure in a height direction of the antenna system including a plurality of antennas in the structure of FIG. 6A.

On the other hand, FIG. 6A is a view illustrating an arrangement structure of an antenna system in accordance with another implementation and FIG. 6B is a view illustrating an internal structure in a height direction of the antenna system including a plurality of antennas in the structure of FIG. 6A.

As illustrated in FIGS. 6A and 6B, the antenna system 1000 may be disposed inside the radome 2000. A metal cradle CR made of a metal may be disposed beneath the antenna system 1000. The metal cradle CR may be connected to the vehicle roof. Accordingly, heat generated in the antenna system 1000 may be emitted to the outside through the metal cradle CR. In this structure, a TCU having a flat antenna structure may be mounted on the metal cradle CR under the vehicle roof. In this case, a plurality of antennas 1100 may be disposed on an upper portion of a circuit board, and a 4G/5G network access device (NAD) 1400 and an application processor (AP) 1450 may be disposed on a heat sink.

In this structure, the height of the plurality of antennas 1100 may extend up to h2 in the antenna system 1000b having an overall height h. Accordingly, the plurality of antennas 1100 can have the extended height h2 in the structure of FIG. 6B, as compared to the structure of FIG. 5B with the limited height h1. For example, when the overall height h of the antenna system of FIG. 5B is 25 mm, the height h1 of the plurality of antennas 1100 may be limited to 5 to 7 mm. On the other hand, when the overall height h of the antenna system of FIG. 6B is 25 mm, the height h2 of the plurality of antennas 1100 may be limited to 16 to 18 mm.

Hereinafter, structural/technical characteristics and measurement method of a first type flat antenna of FIGS. 5A and 5B and a second type flat antenna of FIGS. 6A and 6B will be described. The first type antenna may be subjected to a pattern designing and matching operation for optimizing antenna performance on the basis of an open space. In this regard, an antenna radiation pattern may be measured after installing the first type antenna in a central portion of a metal plate with a predetermined diameter in a state where a metal is not present around the antenna. It may be aimed at securing a radiation pattern similar to a spherical shape with respect to the first type antenna. In this case, the antenna can be designed to acquire an optimal antenna gain in the range of 60 to 70 degrees of elevation.

On the other hand, the second type antenna can obtain optimized antenna performance by antenna pattern designing and matching under the assumption that the antenna system 1000 is fastened to a metal structure. In this regard, the antenna radiation pattern may be measured by manufacturing a metal cradle mounted on a vehicle. In this case, the antenna system 1000 including the metal cradle may be configured to secure a spherical radiation pattern so as to have a more improved reception performance at a low elevation angle.

The radiation pattern of the second type antenna may be referred to as a hemi-spherical radiation pattern. On the other hand, the radiation pattern of the first type antenna may be referred to as an omni-directional radiation pattern. Therefore, the radiation pattern of the second type antenna can be applied to a new antenna structure and method to secure an optimal antenna gain at an elevation angle of about 70 to 90 degrees.

Meanwhile, as the antenna system 1000 is disposed on or inside the vehicle roof, temperature may be increased by an external light source such as the sun. In addition, internal temperature may be increased by heat generated as the antenna system is driven, which may affect the performance of internal components of the antenna system.

As an example, it is desired to enable a TCU operation even at a peak air temperature of 105 degrees within the roof. In this regard, it may be necessary to keep the temperature of main components inside the antenna system below a critical operating temperature. To this end, heat may be generated in the antenna system by an external light source (heat source) such as the sun (i). Also, heat may be generated by heat generation of internal components of the antenna system. Heat may also be conducted to the metal cradle CR on the roof region made of the metal (ii) or introduced through the plastic portion of the vehicle roof region (iii). In this case, as the temperature of the plastic portion of the vehicle roof increases, heat may be accumulated in an inner region of the lower metal cradle. On the other hand, an air layer with a relative low temperature of 85 degrees may exist below the TCU with the flat antenna structure.

Therefore, the present disclosure describes a heat dissipation structure for preventing accumulation of heat in an inner region of a lower metal cradle due to an increase in temperature of a plastic portion of a vehicle roof. It will be clearly understood by those skilled in the art that various changes and modifications to the aforementioned implementations related to the antenna system are made without departing from the idea and scope of the present disclosure. Therefore, it should be understood that such various changes and modifications to the implementations fall within the scope of the appended claims.

Hereinafter, a heat dissipation structure of an antenna system including a plurality of antennas and components according to an implementation will be described. In this regard, the present disclosure describes a heat dissipation structure that prevents internal temperature of an antenna system mounted in a vehicle from being increased by an external heat source. The present disclosure further describes a heat dissipation structure that prevents the performance of internal components of an antenna system from being affected by internal temperature which is increased due to heat generated as the antenna system is driven. The present disclosure further describes improvement of antenna performance and heat dissipation characteristics of an antenna system while maintaining a height of the antenna system to be a predetermined level or less. The present disclosure further describes a structure for mounting an antenna system, which is capable of operating in a broad frequency band to support various communication systems, to a vehicle. The present disclosure further describes implementation of an optimized antenna performance for an antenna system while antenna elements in the antenna system operate in a broad frequency band according to various structures.

Figure 7A:
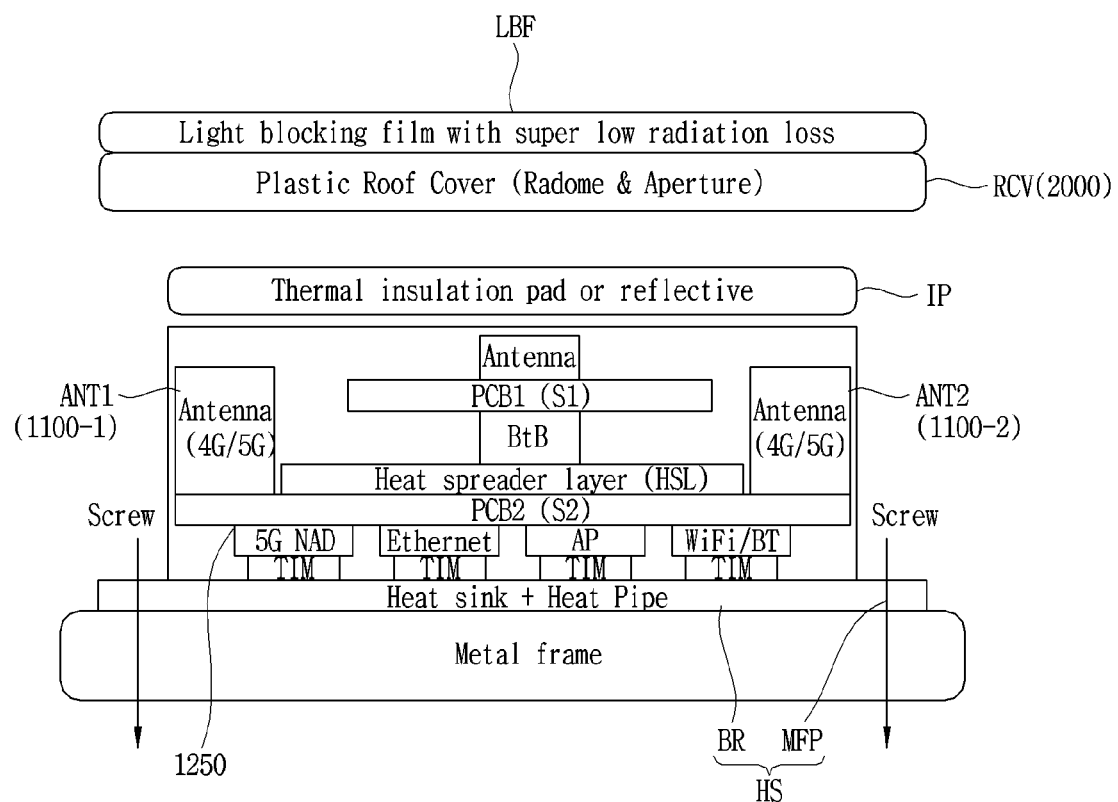
FIG. 7A is a diagram illustrating the configuration of a circuit board, on which a plurality of antennas are disposed, and a heat dissipation structure in accordance with one implementation.
Figure 7B:
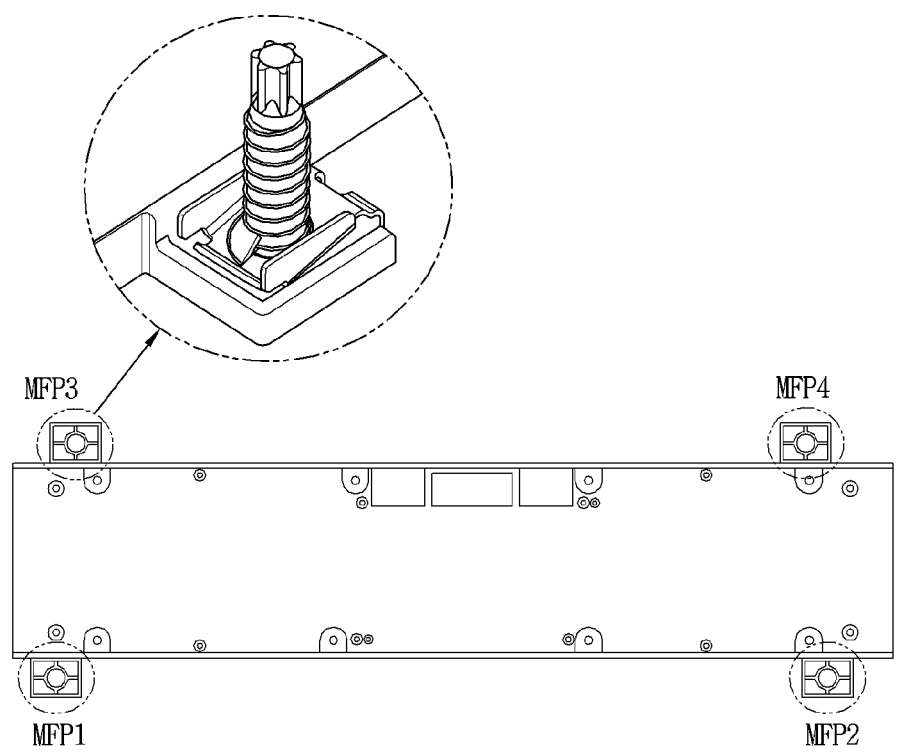
FIG. 7B is a diagram illustrating a structure of a heat sink or a metal frame that can operate as the heat sink.

FIG. 7A is a diagram illustrating the configuration of a circuit board on which a plurality of antennas are disposed and a heat dissipation structure in accordance with one implementation. FIG. 7B is a diagram illustrating a structure of a heat sink or a metal frame that can operate as the heat sink.

Referring to FIGS. 6A to 7B, the antenna system may include a metal cradle CR and a heat sink HS. The antenna system may further include circuit boards S1 and S2 on which antennas or circuit components are disposed.

The metal cradle CR may be disposed inside the roof frame of the vehicle to define a reception portion region. In this case, the metal cradle CR may be fixed to the vehicle roof made of a metal material. The metal cradle CR may have a reception portion region that is formed in a streamlined shape and receives an antenna module therein. In this regard, the antenna system may refer to an antenna module that includes a plurality of antennas and components and has a case. Alternatively, the antenna system may refer to an entire structure that includes the metal cradle CR and the antenna module provided with the plurality of antennas and components and the case.

The circuit boards S1 and S2 may be configured such that antennas or circuit components are disposed thereon. At least one antenna may be disposed on a first substrate S1 as an upper substrate. In addition, a plurality of antennas 1100 that can operate in the 4G/5G band may be disposed on a second substrate S2 as a lower substrate. The plurality of antennas 1100 may include a first antenna (ANT1) 1100-1 and a second antenna module (ANT2) 1110-2. Therefore, MIMO can be carried out through the first antenna ANT1, 1100-1 and the second antenna ANT2, 1100-2.

The antenna arrangement may not be limited to the configuration, and the plurality of antennas 1100 may alternatively be disposed on the first substrate S1 as illustrated in FIGS. 5A and 5B. It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 8:
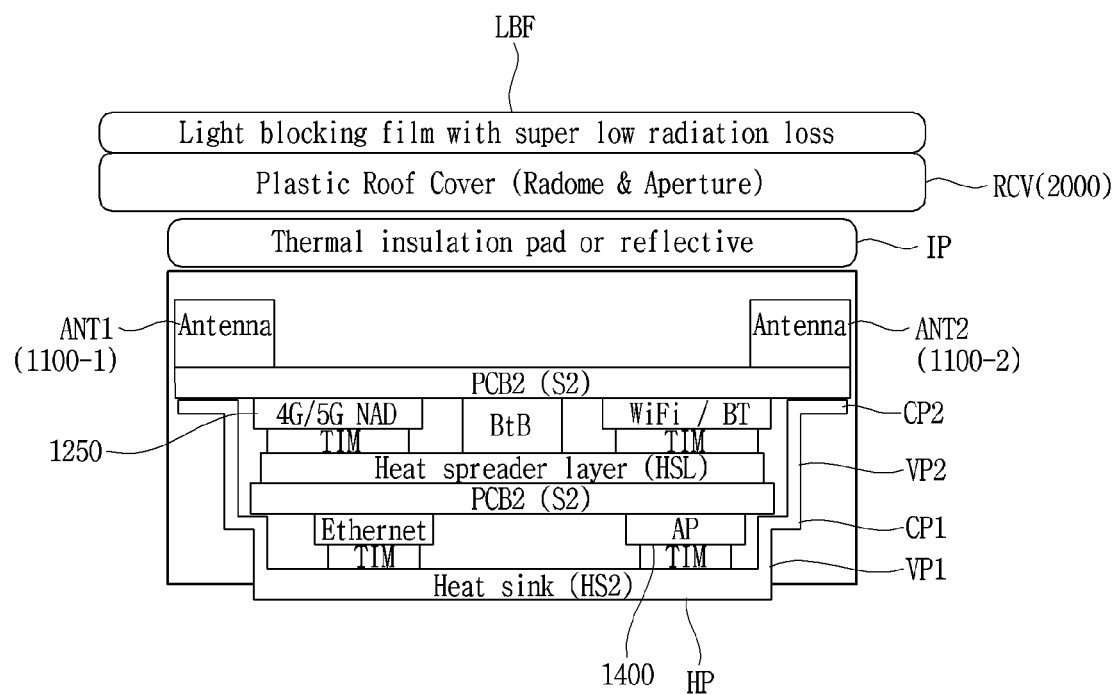
FIG. 8 is a diagram illustrating the configuration of a circuit board, on which a plurality of antennas are disposed, and a heat dissipation structure in accordance with another implementation.

FIG. 8 is a diagram illustrating the configuration of a circuit board, on which a plurality of antennas are disposed, and a heat dissipation structure in accordance with another implementation. Referring to FIG. 8, the plurality of antennas 1100 including the first antenna ANT1, 1100-1 and the second antenna ANT2, 1100-2 may be disposed on the first substrate S1. In this case, a mounting space of the plurality of circuit components can be increased, and accordingly, a second heat sink HS2 can be formed in an optimal structure.

Referring to FIGS. 7A and 8, the heat sink HS, HS2 that extracts heat from the two PCBs S1 and S2 and emits the heat to the air layer of low temperature (85 degrees) beneath the antenna module may be provided. The second heat sink HS2 may be made of an Al material and have a structure brought into contact with rims of the two PCBs to extract heat from the two PCBs S1 and S2 at the same time and dissipate the heat to bottom. It can be confirmed that temperature of about 4 degrees is lowered by a configuration that a thermal insulation material TIM is attached to a heat-generating component to transfer heat to the heat sink HS, HS2. Accordingly, the second heat sink HS2 can have the structure of surrounding all the components, thereby reducing an introduction of heat due to heated air inside the vehicle roof.

Components corresponding to heat sources may be disposed in a distributing manner on the two PCBs S1 and S2, thereby separating hot spots from each other. The NAD 1400 and the AP 1450 corresponding to the main heat sources may be disposed to be separated from each other. This may be a structure that can reduce the overall size of the antenna module by using the two PCBs S1 and S2 and allow upgrade of the antenna module according to 4G communication and 5G communication. It can be confirmed that the temperature of about 1 degree is lowered by the arrangement on the separate PCBs.

A plurality of insulation pads IPs and/or heat spread layers HSLs may be disposed inside and/or outside the antenna system. In addition, a radome cover (RCV) 2000 may be disposed outside the antenna system to protect the antenna system from the outside of the vehicle. Here, a light blocking film LBF may be further disposed to improve a light blocking characteristic of the radome cover.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 9A:
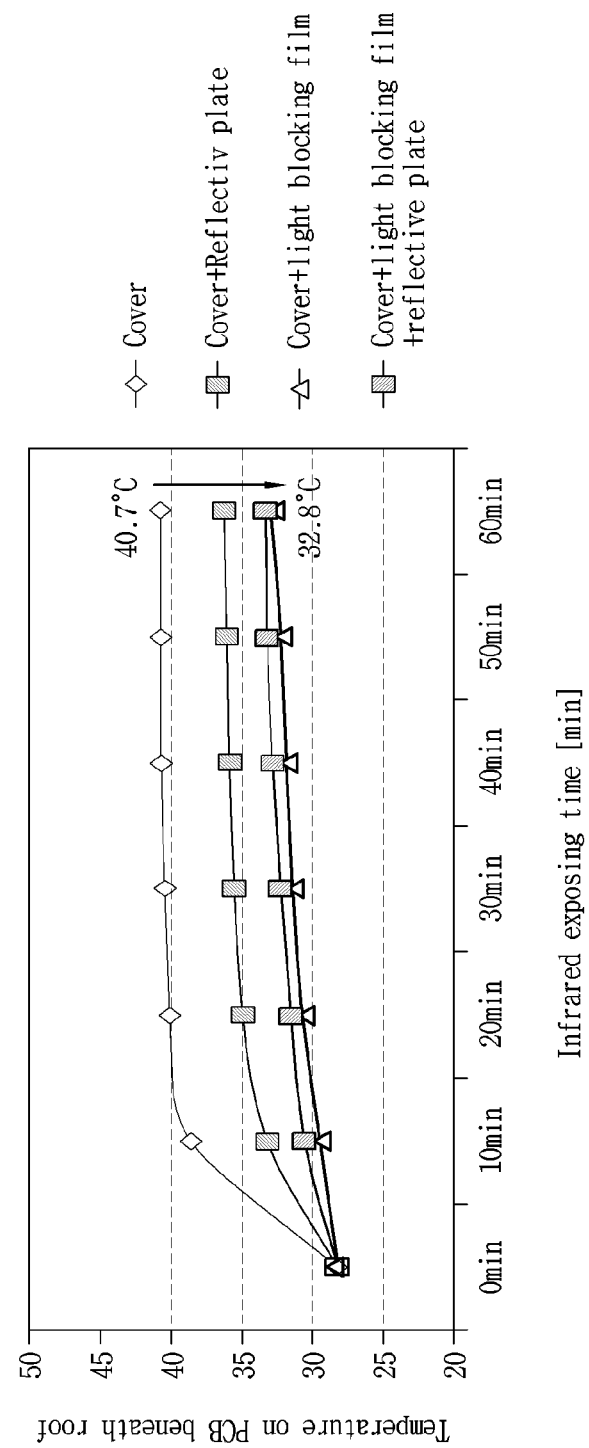
FIG. 9A is a view illustrating comparison of temperature rise in various structures according to ultraviolet (UV) exposing time in accordance with one implementation.

FIG. 9A is a view illustrating comparison of temperature rise in various structures according to ultraviolet (UV) exposing time in accordance with one implementation. Referring to FIG. 9A, it can be seen that the temperature rise is suppressed from 40.7 degrees to 32.8 degrees when the radome cover (RCV) 2000 and the light blocking film LBF are disposed.

In this regard, the antenna system may further include the insulation pad IP. Meanwhile, the antenna system may further include the radome cover RCV. In addition, the antenna system may further include the light blocking film LBF. The insulation pad IP may be disposed on the upper portion of the antenna system to insulate heat. On the other hand, the radome cover RCV may be disposed on an upper portion of the insulation pad IP, such that radio waves radiated from the plurality of antennas disposed inside the antenna system can pass therethrough. In addition, the light blocking film LBF may be disposed on an upper portion of the radome cover to block light from being incident to the reception portion region inside the metal cradle.

Specifically, the light blocking film LBF may be employed to delay or lower a temperature rise in the vehicle caused by a flow of heat due to a value of solar radiation. A maximum temperature drop of 8 degrees can be confirmed when applying the light blocking film LBF and the thermal insulation pad IP. The light blocking film LBF may be implemented as a film that serves to reduce light transmittance and attenuates a radio wave of less than 0.2 dB into the vehicle.

Meanwhile, the heat sink HS may be disposed on a rear surface of the antenna system to be fixed to the reception portion region. In this regard, the antenna module may have a low-profile structure that the entire height of the antenna module is about 25 mm. In the structure, heat generated in the AP 1450 disposed on the second substrate PCB2, S2 may rise upward and affect the NAD 1400, thereby reducing the survivability of the antenna module (system) at a high temperature. Accordingly, the heat spread layer HSL may be disposed to spread or block heat of the second substrate PCB2, S2 in an intermediate region. It can be confirmed that a thermal improvement effect of about 3.5 degrees is obtained by the heat spread layer HSL.

Meanwhile, the heat sink HS may include a body region BR and a plurality of module fixation portions MFPs. The body region BR may have a predetermined length and width and may have at least one aperture region. Also, the plurality of module fixation portion MFPs may be integrally formed with the body region BR and configured to be fixed to the metal cradle by screws.

As an example, the plurality of module fixation portions MFP1 to MFP4 may be integrally formed with the body region BR and fixed to the metal cradle by screws so as to operate as a thermal bridge. Meanwhile, the plurality of module fixation portions MFP1 to MFP4 may be located at different positions on front and rear ends of the body region BR. Accordingly, when the plurality of module fixation portions MFP1 to MFP4 are fastened to the metal cradle, mechanical stability can be secured and efficiency as the thermal bridge by plural different heat sources can also be improved.

In particular, the module fixation portions MFP1 to MFP4 may be designed to be formed on the heat sink HS, and the antenna module can be fastened to the metal frame of the vehicle by using metal screws. The related art heat sink is configured to transfer heat from a metal region to the atmosphere, but the present disclosure employs the thermal bridge type. That is, the thermal bridge enables a heat dissipation method through a direct contact between the heat sink of the antenna module and the metal frame of the vehicle.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

FIG. 9B is a view illustrating a thermal simulation result inside an antenna system in accordance with one implementation. FIG. 9B illustrates temperature characteristics for each component according to presence or absence of a metal frame in the structure illustrated in FIG. 7A. Referring to FIG. 9B, thermal improvement of up to 11 degrees can be confirmed in an atmospheric condition of 50 degrees, as a result of the simulation.

As described above, referring to FIG. 8, the second heat sink HS2 may have an optimal structure for blocking heat. Referring to FIGS. 5A to 8, the antenna system may include the first substrate S1, the second substrate S2, and the second heat sink HS2. At least one antenna may be disposed on the first substrate S1. The second substrate S2 may be disposed below the first substrate S1 in parallel to the first substrate S1. In the structure of FIG. 7A, a GNSS or SDARS antenna may be disposed on the first substrate S1. On the other hand, in the structure of FIG. 8, the first antenna ANT1, 1100-1 and the second antenna ANT2, 1100-2 that can operate in the 4G/5G band may be disposed on the first substrate S1.

In this regard, the second heat sink HS2 may be formed to surround the second substrate S2 below the second substrate S2. In addition, the second heat sink HS2 may extend up to a lower portion of the first substrate S1. Meanwhile, the second heat sink HS2 may include a horizontal portion HP and a vertical portion. In this regard, the second heat sink HS2 may include a plurality of vertical portions. In this case, the vertical portions may be referred to as a first vertical portion VP1. Meanwhile, the horizontal portion HP may be connected (i.e., interfaced) with components disposed on a rear surface of the second substrate S2 through a thermal interface material TIM. Also, the first vertical portion VP1 may extend vertically to the horizontal portion HP to surround the components.

Meanwhile, the second heat sink HS2 may further include a first connection portion CP1. The second heat sink HS2 may further include a second vertical portion VP2. The second heat sink HS2 may further include a second connection portion CP2. In this regard, the first connection portion CP1 may be connected to the first vertical portion VP1 and disposed beneath the second substrate S2. Meanwhile, the second vertical portion VP2 may extend vertically to the first connection portion CP1 and surround components disposed on the rear surface of the first substrate S1. Also, the second connection portion CP2 may be connected to the second vertical portion VP2 and disposed beneath the first substrate S1.

Meanwhile, in relation to a performance improvement mechanism by blocking heat transfer between a plurality of processors, the heat sink HS and/or the second heat sink HS2 may perform a heat blocking mechanism. The thermal interface material TIM and/or the heat spread layer HSL may also perform the heat blocking mechanism.

In this regard, the antenna system may include a first processor 1400 and a second processor 1450. Here, the first processor 1400 and the second processor 1450 may not be limited to the NAD and the AP. That is, the antenna system may include any processors in a situation in which heat generated by one processor is transferred to another processor. The first processor 1400 may be configured to process a signal from at least one antenna. On the other hand, the second processor 1450 may be disposed on the rear surface of the second substrate S2 to control the first processor 1400.

In one implementation, heat generated by the first processor and heat generated by the second processor may be dissipated to a space below the second heat sink HS2 by the second heat sink HS2 that is in contact with the first substrate S1 and the second substrate S2. The heat spread layer HSL may be disposed on the upper portion of the second substrate. In this regard, the heat spread layer HSL may be interfaced (i.e., connected) with the first processor through the thermal interface material TIM. The heat spread layer HSL may be configured to spread heat generated from the second substrate S2 by the second processor so as to prevent the heat from being transferred to the first processor. Also, the heat spread layer HSL may be configured to spread heat generated from the first substrate S1 by the first processor so as to prevent the heat from being transferred to the second processor.

In another implementation, when internal temperature of the metal cradle is higher than or equal to a threshold value, the first processor 1400 may control an input power or gain of an amplifier therein so that an RF output of the amplifier can be reduced. To this end, the antenna system (module) may be provided therein with a temperature sensor for measuring the internal temperature of the metal cradle. Also, the output of the power amplifier may be measured to estimate the internal temperature of the metal cradle.

In another implementation, the second processor 1450 may perform a temperature-based fan control. Specifically, the second processor 1450 may control a fan module, which is disposed inside or outside the metal cradle, to blow air into the metal cradle when the internal temperature of the metal cradle is equal to or higher than a threshold value. To this end, the antenna system (module) may be provided therein with a temperature sensor for measuring the internal temperature of the metal cradle. Also, the output of the power amplifier may be measured to estimate the internal temperature of the metal cradle.

The antenna system including the plurality of antennas and components as described above can prevent the increase in internal temperature through the heat dissipation structure and guarantee the performance of the components. Meanwhile, the heat dissipation structure of the antenna system can improve heat dissipation characteristics by optimizing the structure of heat sink fin and heat pipe.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 10A:
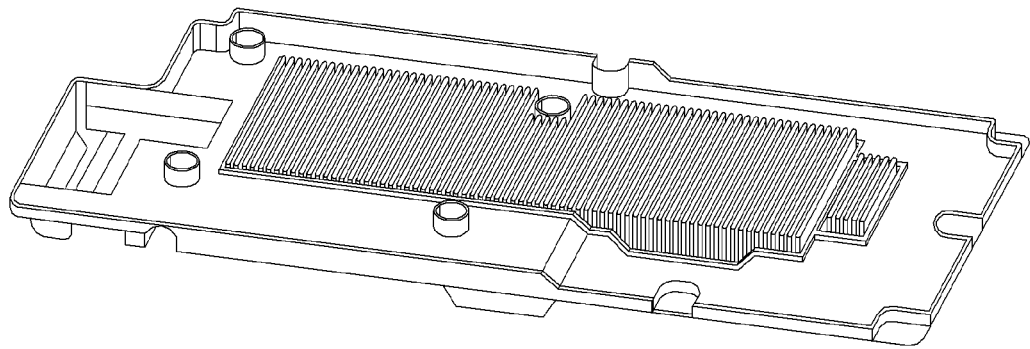
FIG. 10A is a view illustrating a heat dissipation structure having a straight fin in accordance with one implementation.
Figure 10B:
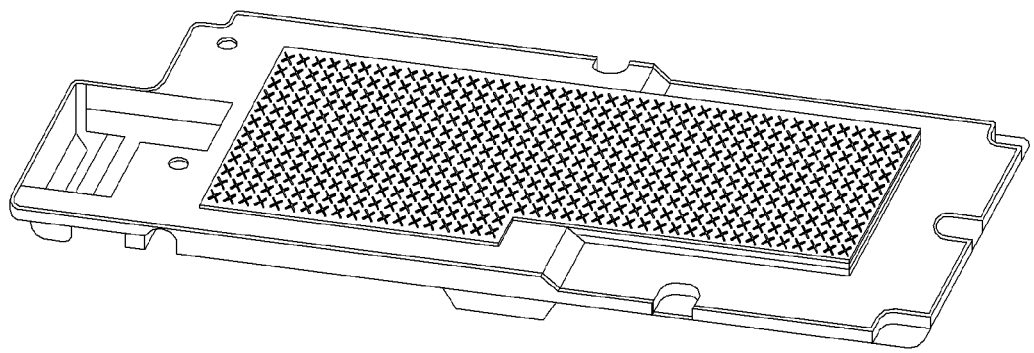
FIG. 10B is a view illustrating a heat dissipation structure having a cross fin in accordance with another implementation.
Figure 10C:
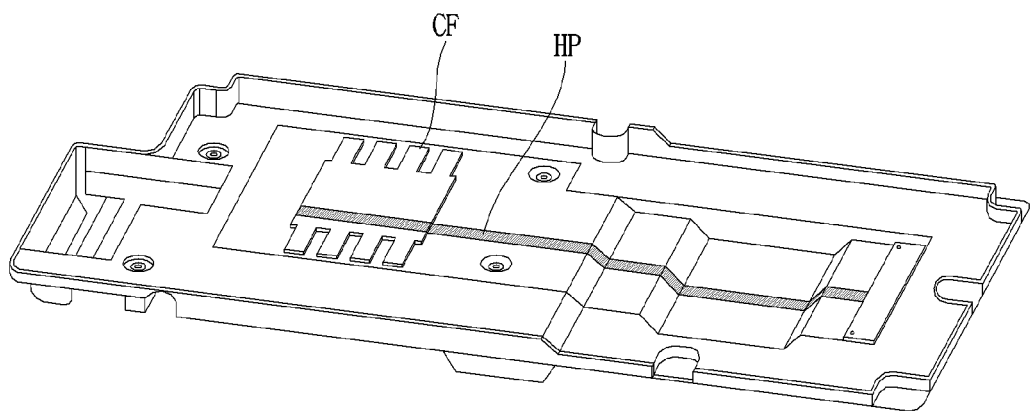
FIG. 10C is a view illustrating a heat dissipation structure having a cross fin and a heat pipe in accordance with still another implementation.

FIG. 10A is a view illustrating a heat dissipation structure having a straight fin in accordance with one implementation. FIG. 10B is a view illustrating a heat dissipation structure having a cross fin in accordance with another implementation. FIG. 10C is a view illustrating a heat dissipation structure having a cross fin and a heat pipe in accordance with still another implementation.

Referring to FIGS. 5A to 8, 10B, and 10C, the heat sink HS may include a cross fin CF. In addition, the heat sink HS may further include a heat pipe HP formed through the fin. Specifically, in the present disclosure, an optimal heat sink fin shape can be applied to improve efficiency of dissipating heat to the air through the heat sink HS. In an example, the cross fin CF and, for example, a heat pipe HP with heat input of 10 W may be applied together.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

FIG. 11 is a view illustrating a simulation result for each component in the heat dissipation structures according to FIGS. 10A to 10C. In relation to the simulation of FIG. 11, the 5G NAD 1400 should operate even when air temperature inside the vehicle roof is at the peak of 105 degrees. To this end, the heat dissipation structure of FIGS. 10A to 10C may be applied. That is, a method of improving heat dissipation inside the antenna module and conducting internal heat to the outside using the metal cradle may be applied. Therefore, an additional heat dissipation structure can be applied to the existing flat antenna TCU heat dissipation design structure to improve performance while ensuring antenna performance.

Referring to FIG. 11, it can be seen that the temperature of the cross fin structure is about 4 degrees lower than that of the straight fin structure with respect to the internal components of the NAD module 1400. On the other hand, it can be seen that the temperature of the structure with the cross fin and the heat pipe is about 4.5 degrees lower than that of the straight fin structure with respect to the internal components of the NAD module 1400. Therefore, a temperature improvement effect of 4.5 to 17 degrees or more can be confirmed through simulation in an atmospheric environment of 95 degrees compared to a shape without a fin based on aluminum (Al) die casting.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 12A:
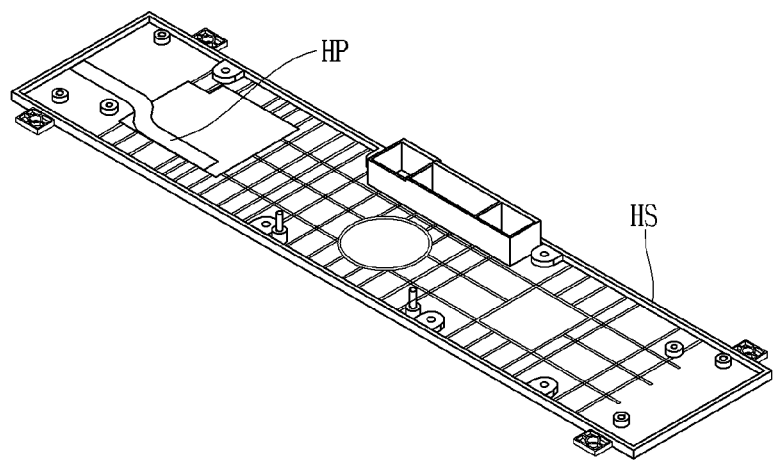
FIG. 12A is a view illustrating a shape of a heat pipe disposed in a heat sink region in accordance with one implementation.
Figure 12B:
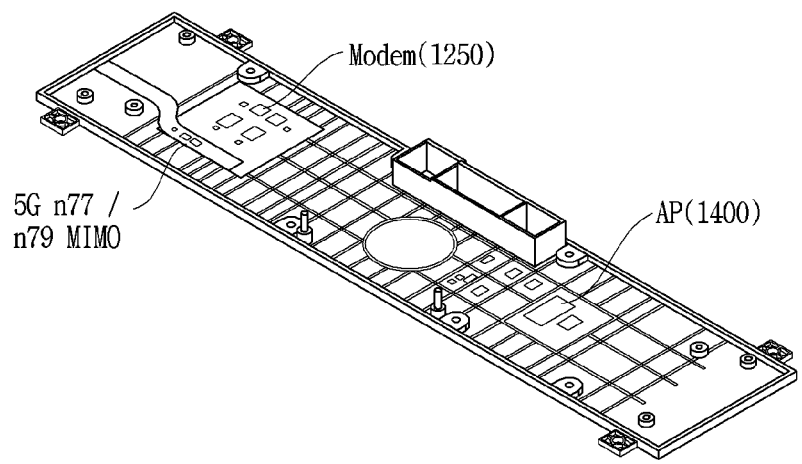
FIG. 12B is a view illustrating a structure in which components are disposed at positions corresponding to the heat sink region.

In one implementation, the shape of the heat pipe may be optimized in the heat dissipation structure for the antenna system. In this regard, FIG. 12A is a view illustrating a shape of a heat pipe disposed in a heat sink region in accordance with one implementation. FIG. 12B is a view illustrating a structure in which components are disposed at positions corresponding to the heat sink region. Referring to FIGS. 5A to 8 and 12A, the heat pipe HP may be formed in a bent shape to correspond to the shape of the metal cradle CR.

On the other hand, in the present disclosure, an optimal heat sink fin shape can be applied to improve efficiency of dissipating heat to the air through the heat sink HS. Referring to FIGS. 5A to 8, 12A, and 12B, it may be assumed that a plurality of heat sources are disposed at different positions of the heat sink HS. Here, the plurality of heat sources may be the components such as the modem 1400 and the AP 1450. Specifically, the plurality of heat sources may include a plurality of components disposed on a main PCB corresponding to the second substrate S2 and the NAD 1400 corresponding to the modem. Here, the components disposed on the main PCB may include an ethernet PHY, an eMMC, a PMIC, the AP 1450, and a memory such as LPDDR4. In addition, the NAD 1400 may include a PMIC, a modem, an MCP, a transceiver, a 5G n77_MIMO module and a 5G n79_MIMO module.

In the antenna system including the main PCB including such components and the NAD 1400, the temperature rise due to heat generated from the internal components can be reduced through the optimized heat pipe HP having the bent shape.

In the present disclosure, a method of improving heat dissipation inside the antenna module and conducting internal heat to the outside using the metal cradle may be applied. In this regard, a heat dissipation structure that enables operation even when air temperature inside the vehicle roof is at a peak of 105 degrees may be provided. That is, a method of improving heat dissipation inside the antenna module and conducting internal heat to the outside using the metal cradle may be applied. Also, according to one implementation, a result that satisfies an operation condition at 105 degrees may be obtained as a result of the 105-degree simulation. By applying the heat pipe, the temperature of the 5G NAD 1400, which is a specific hot spot module, can be further lowered. Accordingly, the heat dissipation structure including the heat dissipation fin and the heat pipe according to the implementation may be required to implement the 5G telematics module.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 13A:
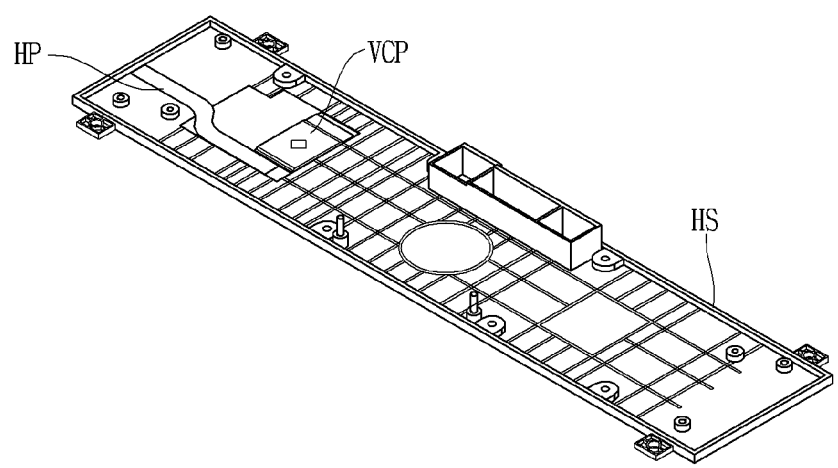
FIG. 13A is a view illustrating a heat pipe structure having a vacuum chamber portion in accordance with one implementation.

In one implementation, a heat sink structure optimized to lower the internal temperature of the antenna system (module) may be applied. FIG. 13A is a view illustrating a heat pipe structure having a vacuum chamber portion in accordance with one implementation. FIG. 13B is a view illustrating shapes and operating conditions of vacuum chamber portions and heat pipes of various structures.

Referring to FIGS. 5A to 8 and 13A, the heat sink HS may further include a vacuum chamber portion VCP connected to the heat pipe HP and formed of a metal plate with a predetermined width and length. The vacuum chamber portion VCP may be configured to dissipate heat moved in one direction along the heat pipe HP to an external space of the metal cradle through a corresponding area.

Referring to FIG. 13B, the vacuum chamber portion VCP may be formed to be flat, rectangular, surface-embossed, or bent in a z-axis direction. In this regard, the vacuum chamber portion VCP may be implemented as a first VCP VCP1 having a surface embossing structure. Alternatively, the vacuum chamber portion VCP may be implemented as a second VCP VCP2 having a z-axial bending structure.

For example, the vacuum chamber portion VCP may have a rectangular structure having a dimension of about 20 mm to 75 mm. The vacuum chamber portion VCP may be used for two-dimensional heat spread in a low air flow condition in a structure in which the z-axial height is limited. In this regard, compared to the structure in which heat moves in only one direction through the heat pipe HP, the vacuum chamber portion VCP can discharge heat over a large area. Therefore, in the present disclosure, the vacuum chamber portion VCP may be applied to the heat sink HS together with the heat pipe HP.

Meanwhile, the heat pipe HP may be formed to have a diameter of about 3 mm to 8 mm or a diameter of about 0.8 mm to 2.2 mm. The heat pipe HP may have a round shape, a flat shape, or a bent shape. The heat pipe HP may be used for one-dimensional heat spread in a plenty of air flow conditions. Accordingly, referring to FIGS. 5A to 8, 13A, and 13B, heat generated in the 5G NAD 1400 may be spread to other regions along the heat pipe HP through the one-dimensional heat spread. That is, heat can be moved through the heat pipe HP to another region at a distance where the heat source does not exist. In addition, heat spread to another region in which a heat source does not exist can be efficiently dissipated through the entire region by the two-dimensional heat spread through the vacuum chamber portion VCP.

The foregoing description has been given of the antenna system having the plurality of antennas and the heat dissipation structure. Hereinafter, a vehicle in which an antenna system including a plurality of antennas and components and a heat dissipation structure is mounted will be described. In this regard, the description of the antenna system and the heat dissipation structure described above may also be applied to the vehicle.

It will be clearly understood by those skilled in the art that various changes and modifications to the aforementioned implementations related to the heat dissipation structure of the antenna system having the plurality of antennas are made without departing from the idea and scope of the present disclosure. Therefore, it should be understood that such various changes and modifications to the implementations fall within the scope of the appended claims.

Figure 14A:
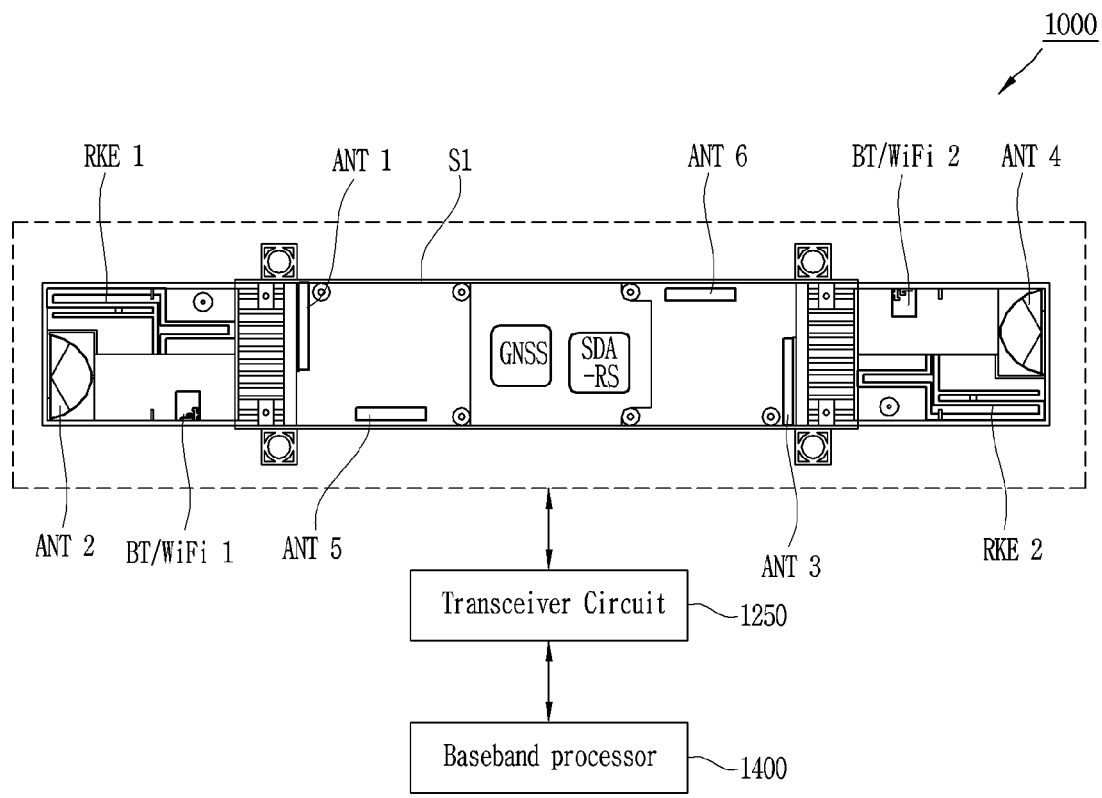
FIG. 14A is a diagram illustrating the configuration of controlling a circuit board on which a plurality of antennas are disposed and the antennas in accordance with one implementation.
Figure 14B:
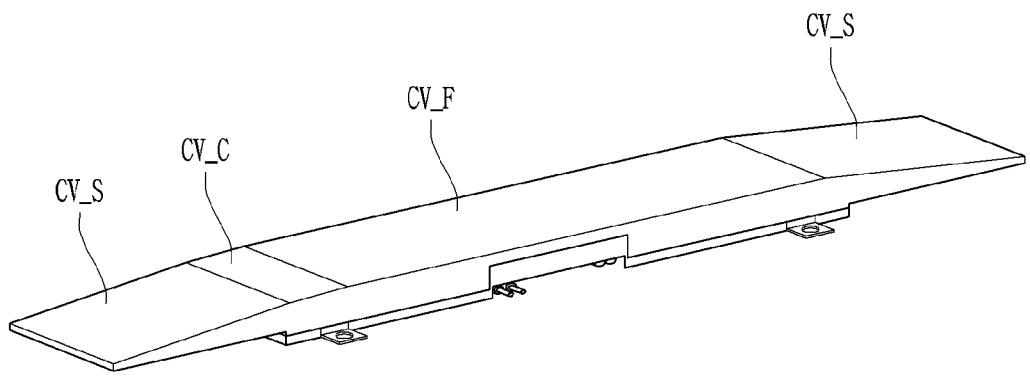
FIG. 14B is a view illustrating a shape of a cover operating as a radome of the antenna system.
Figure 15:
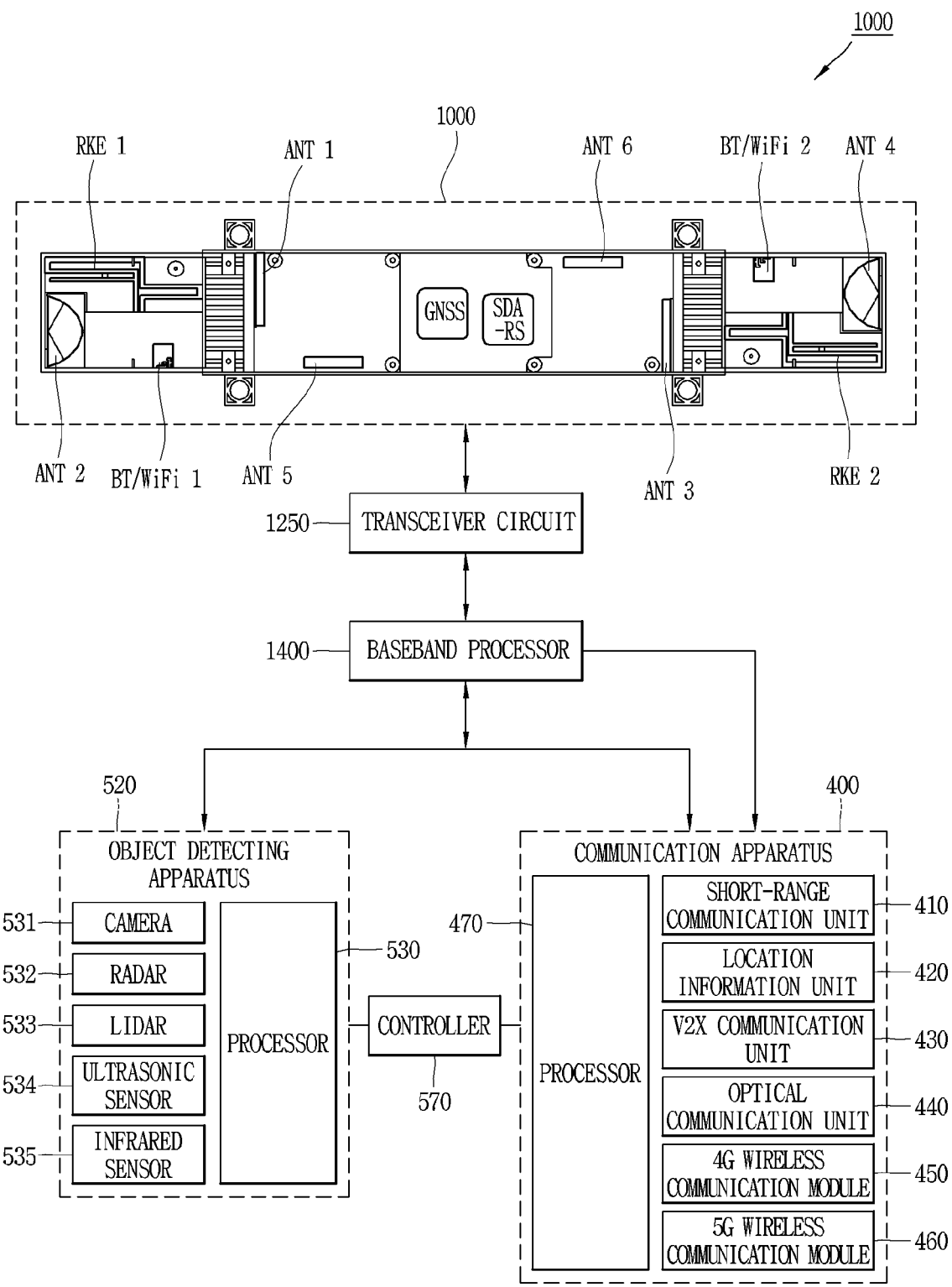
FIG. 15 is a diagram illustrating a control configuration between an antenna system having a plurality of antennas and other devices in a vehicle.

FIG. 14A is a diagram illustrating the configuration of controlling a circuit board on which a plurality of antennas are disposed and the antennas in accordance with one implementation. FIG. 14B is a view illustrating a shape of a cover operating as a radome of the antenna system. FIG. 15 is a diagram illustrating a control configuration between an antenna system having a plurality of antennas and other devices in a vehicle.

Referring to FIG. 14A, a plurality of antennas 1100 may include a first antenna ANT1 or a second antenna ANT2. The first antenna ANT1 may be connected to a first feeder of a circuit board S1 and may be configured to radiate a first signal through a first metal patch disposed on a front surface and one side surface of a dielectric carrier DC. On the other hand, the second antenna ANT2 may be connected to a second feeder of the circuit board S1 and may be configured to radiate a second signal through a second metal patch disposed on the front surface and the one side surface of the dielectric carrier DC.

In this regard, the first antenna ANT1 may be disposed in an antenna region corresponding to a central region of the circuit board S1. In this case, another side surface of the dielectric carrier DC of the first antenna ANT1, 1100*a* may be disposed on the circuit board S1. Meanwhile, the second antenna ANT2 may be disposed in a remote keyless entry (RKE) region disposed on the one side surface of the circuit board S1. In this case, a rear surface of the dielectric carrier of the second antenna ANT2 may be disposed on the circuit board S1.

In regard to the plurality of antennas 1100 disposed in the antenna system according to the one implementation, antenna technologies optimized to support low elevation radiation may be applied. In this regard, a low-profile structure may be implemented by using a metal patch disposed on a dielectric carrier for a broadband operation in the range of 615 MHz to 3800 MHz. Meanwhile, such a broadband antenna structure may be provided with a small number of antennas relative to other antenna systems, to be disposed in a vehicle. This may result from that one antenna element can operate as a radiator in a middle band MB and a high band HB in addition to a low band LB. In addition, as the low-profile antenna implemented on the dielectric carrier is arranged in a small size on the circuit board S1, the ground cut can be minimized in the ground region, thereby facilitating the TCU circuit components to be mounted.

The plurality of antennas 1100 according to the one implementation may include a third antenna ANT3 or a fourth antenna ANT4. The third antenna ANT3 may be connected to a third feeder of the circuit board S1 and may be configured to radiate a third signal through a third metal patch disposed on a front surface and one side of the dielectric carrier DC. In addition, the fourth antenna ANT4 may be connected to a fourth feeder of the circuit board S1 and may be configured to radiate a fourth signal through a fourth metal patch disposed on the front surface and the one side surface of the dielectric carrier DC. In this case, the third antenna ANT3 may be disposed in an antenna region corresponding to a central region of the circuit board S1. On the other hand, the fourth antenna ANT4 may be disposed in a remote keyless entry (RKE) region disposed on another side of the circuit board S1.

Meanwhile, the plurality of antennas 1100 according to the one implementation may include a fifth antenna ANT5 or a sixth antenna ANT6. The fifth antenna ANT5 may be connected to a fifth feeder of the circuit board S1 and may be configured to radiate a fifth signal through a fifth metal patch disposed on a front surface and one side of the dielectric carrier DC. In addition, the sixth antenna ANT6 may be connected to a sixth feeder of the circuit board S1 and may be configured to radiate a sixth signal through a sixth metal patch disposed on the front surface and the one side surface of the dielectric carrier DC. In this case, the fifth antenna ANT5 and the sixth antenna ANT6 may be disposed in the antenna region corresponding to the central region of the circuit board S1.

The plurality of antennas 1100 disposed on the circuit board S1 in the antenna system 1100 may be controlled by a transceiver circuit 1250 and/or a baseband processor 1400. Accordingly, the antenna system 1100 according to the one implementation may include the transceiver circuit 1250 and/or the baseband processor 1400.

The transceiver circuit 1250 may be disposed on the circuit board S1 or another circuit board. The transceiver circuit 1250 may control a signal to be radiated through at least one of the first antenna ANT1 and the second antenna ANT2. The baseband processor 1400 may be disposed on the circuit board S1 or another circuit board, and operatively connected to the transceiver circuit 1250. The baseband processor 1400 may be disposed on the rear surface of the circuit board S1. The baseband processor 1400 may perform MIMO by radiating the first signal and the second signal through the first antenna ANT1 and the second antenna ANT2.

The first antenna ANT1 may be disposed on one side in the antenna region of the circuit board S1, and the third antenna ANT3 may be disposed on another side in the antenna region. Also, the fifth antenna ANT5 may be disposed on a lower portion of the antenna region, and the sixth antenna ANT6 may be disposed on an upper portion of the antenna region.

In this regard, the fifth antenna ANT5 may be disposed at an angle rotated by a predetermined angle with respect to the first antenna ANT1. In one example, the fifth antenna ANT5 may be disposed at an angle rotated by 90 degrees with respect to the first antenna ANT1. On the other hand, the third antenna ANT3 may be disposed at an angle rotated by a predetermined angle with respect to the fifth antenna ANT5. In one example, the third antenna ANT3 may be disposed at an angle rotated by 90 degrees with respect to the fifth antenna ANT5. Also, the sixth antenna ANT6 may be disposed at an angle rotated by a predetermined angle with respect to the third antenna ANT3. In one example, the sixth antenna ANT6 may be disposed at an angle rotated by 90 degrees with respect to the third antenna ANT3.

Meanwhile, the plurality of antennas ANT2 and ANT4 may be disposed adjacent to the RKE antennas RKE1 and RKE2. In this regard, the second antenna ANT2 may be disposed in a first RKE region disposed on one side of the circuit board S1. In addition, the fourth antenna ANT4 may be disposed in a second RKE region disposed on another side of the circuit board S1.

It will be clearly understood by those skilled in the art that various changes and modifications to the aforementioned implementations related to the antenna system and the plurality of antennas are made without departing from the idea and scope of the present disclosure. Therefore, it should be understood that such various changes and modifications to the implementations fall within the scope of the appended claims.

Referring to FIG. 14B, the antenna system 1000 may be configured to protect internal components by a cover. In this regard, the cover may include a flat cover (CV_F) region that is coupled to the antenna region, which is the central region of the circuit board, and is formed in a flat shape.

In one implementation, the cover may further include slanted cover (CV_S) regions that are coupled to RKE regions, which are side regions of the circuit board, and are formed in a slanted shape. In addition, the cover may further include a connected cover (CV_C) region that is formed between the flat cover (CV_F) region and the slanted cover (CV_S) region. When the antenna system 1000 is mounted on the vehicle roof or inside the roof frame of the vehicle, antennas can be disposed even in side regions inside the vehicle by virtue of the cover formed in the streamlined shape.

Referring to FIGS. 1 to 15, the antenna system 1000 may include a circuit board S1 and a plurality of antennas 1100. Here, the circuit board S1 may be disposed to be spaced apart by a predetermined distance from a metal frame, which is disposed inside the roof or roof frame of the vehicle. In this case, the metal frame may correspond to a lower end of the antenna system 1000 and may be implemented as a heat sink. Accordingly, the vehicle 500 having the antenna system may include the antenna system 1000. Also, the vehicle 500 may include a plurality of processors 1250, 1400, and 1450 in addition to the antenna system 1000. In this regard, the first processor and the second processor may be the NAD and the AP as described above. In another implementation, the first processor 1250 may be a transceiver circuit included in the NAD, and the second processor 1400 may be a modem (baseband processor) included in the NAD.

The vehicle 500 may include a metal cradle CR disposed inside the roof frame of the vehicle and configured to define a reception portion region. Meanwhile, the vehicle 500 may further include an antenna system (module) 1000 that is disposed in the reception portion region of the metal cradle and includes a first substrate S1 and a second substrate S2 disposed below the first substrate. Also, the vehicle 500 may further include a first processor 1400 disposed on the first substrate S1 or the second substrate S2 and configured to process signals from the plurality of antennas 1100. Also, the vehicle 500 may further include a second processor 1450 disposed on the second substrate S2 and configured to control the first processor 1400.

The vehicle 500 may further include a heat sink HS disposed on a rear surface of the antenna system and configured to be fixed to the metal cradle. Here, the heat sink HS may include a body region BR having a predetermined length and width and at least one aperture region. In addition, the heat sink HS may further include a plurality of module fixation portions MFP formed integrally with the body region BR and configured to be fixed to the metal cradle by screws. In this case, the plurality of module fixation portions MFP1 to MFP4 may operate as a thermal bridge and may be located at different positions on front and rear ends of the body region BR.

In one implementation, the antenna system 1000 may include an insulation pad IP disposed on the antenna system and configured to insulate heat. Meanwhile, the antenna system 1000 may further include a radome cover RCV disposed on an upper portion of the insulation pad IP, such that radio waves radiated from the plurality of antennas disposed inside the antenna system can pass therethrough. The antenna system 1000 may further include a light blocking film LBF disposed on an upper portion of the radome cover to block light from being incident to the reception portion region inside the vehicle.

According to an embodiment, the antenna system 1000 may further include a second heat sink HS2 that is disposed beneath the second substrate S2 to surround the second substrate S2 and extends up to a lower portion of the first substrate S1. Here, the second heat sink HS2 may include a horizontal portion HP that interfaces with components disposed on the rear surface of the second substrate through a thermal interface material TIM. The second heat sink HS2 may further include a first vertical portion VP1 that extends vertically to the horizontal portion HP to surround the components.

The second heat sink HS2 may further include a first connection portion CP1 connected to the first vertical portion and disposed beneath the second substrate S2. The second vertical portion HS2 may further include a second vertical portion that extends vertically to the first connection portion CP1 and surrounds components disposed on the rear surface of the first substrate S1. The second heat sink HS2 may further include a second connection portion CP2 connected to the second vertical portion and disposed beneath the first substrate S1.

In another implementation, the antenna system 1000 may further include a heat spread layer HSL disposed on the upper portion of the second substrate S2. The heat spread layer HSL may interface (be in contact or connected) with the first processor 1400 through a heat interface material TIM. The heat spread layer HSL may be configured to spread heat generated from the second substrate S2 by the second processor 1450 so as to prevent the heat from being transferred to the first processor 1400. The heat spread layer HSL may also be configured to spread heat generated from the second substrate S2 by the first processor 1400 so as to prevent the heat from being transferred to the second processor 1450.

In this regard, the first processor 1250 may receive a first signal of a first frequency band from a first entity through the first antenna ANT1, 1100-1 disposed on the first substrate S1 or the second substrate S2. Also, the first processor 1250 may control the transceiver circuit 1250 to receive a second signal of a second frequency band from a second entity through the second antenna ANT2, 1100-2 disposed on the same plane as the first antenna. Accordingly, the vehicle 500 can perform communication with a base station as the first entity and V2V communication with another vehicle as the second entity.

It will be clearly understood by those skilled in the art that various changes and modifications to the aforementioned implementations related to the antenna system having the plurality of antennas and the vehicle having the antenna system are made without departing from the idea and scope of the present disclosure. Therefore, it should be understood that such various changes and modifications to the implementations fall within the scope of the appended claims.

Referring to FIG. 15, the broadband antenna system 1000 may be mounted on the vehicle. The antenna system may perform short-range communication, wireless communication, V2X communication, and the like by itself or through the communication apparatus 400. To this end, the baseband processor 1400 may be configured to receive signals from or transmit signals to adjacent vehicles, RSUs, and base stations through the antenna system 1000.

Alternatively, the baseband processor 1400 may be configured to receive signals from or transmit signals to adjacent vehicles, RSUs, and base stations through the communication apparatus 400. Here, the information related to adjacent objects may be acquired through the object detecting apparatus such as the camera 331, the radar 332, the LiDar 333, and the sensors 334 and 335 of the vehicle 300. Alternatively, the baseband processor 1400 may be configured to receive signals from or transmit signals to adjacent vehicles, RSUs, and base stations through the communication apparatus 400 and the antenna system 1000.

Meanwhile, referring to FIGS. 1 to 15, the vehicle 500 having the antenna system 1000 may include the plurality of antennas 1100, the transceiver circuit 1250, and the baseband processor 1400. The vehicle 500 may further include the object detecting apparatus 520. The vehicle 500 may further include the communication apparatus 400. Here, the communication apparatus 400 may be configured to perform wireless communication through an indoor antenna unit.

In this regard, the vehicle 500 may be provided with the antenna system 1000. The antenna system 1000 may include the circuit board S1 and the plurality of antennas 1100. The antenna system 1000 may further include the transceiver circuit 1250 and the baseband processor 1400.

The circuit board S1 may be disposed to be spaced apart by a predetermined distance from a metal frame, which is disposed inside the roof or roof frame of the vehicle. In this case, the metal frame may correspond to a lower end of the antenna system 1000 and may be implemented as a heat sink. The plurality of antennas 1100 disposed on the circuit board S1 in the antenna system 1100 may be controlled by the transceiver circuit 1250 and/or the baseband processor 1400. Accordingly, the antenna system 1100 according to the one implementation may include the transceiver circuit 1250 and/or the baseband processor 1400.

The transceiver circuit 1250 may be disposed on the circuit board S1 or another circuit board. The transceiver circuit 1250 may control a signal to be radiated through at least one of the first antenna ANT1 and the second antenna ANT2. The baseband processor 1400 may be disposed on the circuit board S1 or another circuit board, and operatively connected to the transceiver circuit 1250. The baseband processor 1400 may be disposed on the rear surface of the circuit board S1. The baseband processor 1400 may perform MIMO by radiating the first signal and the second signal through the first antenna ANT1 and the second antenna ANT2.

In this regard, the first antenna ANT1 and the second antenna ANT2 may be configured to perform MIMO in the LB band. The first antenna ANT1 and the second antenna ANT2 may be configured to perform MIMO in the MB/HB band. In this case, the fifth antenna ANT5 and the sixth antenna ANT6 may be configured to perform MIMO in the MB/HB band. The third antenna ANT3 and the fourth antenna ANT4 may be configured to operate as DSDA antennas in the LB/MB/HB band.

The first antenna ANT1 may be disposed on one side in the antenna region of the circuit board S1, and the third antenna ANT3 may be disposed on another side in the antenna region. Also, the fifth antenna ANT5 may be disposed on a lower portion of the antenna region, and the sixth antenna ANT6 may be disposed on an upper portion of the antenna region. In this regard, the fifth antenna ANT5 may be disposed at an angle rotated by a predetermined angle with respect to the first antenna ANT1. In one example, the fifth antenna ANT5 may be disposed at an angle rotated by 90 degrees with respect to the first antenna ANT1. On the other hand, the third antenna ANT3 may be disposed at an angle rotated by a predetermined angle with respect to the fifth antenna ANT5. In one example, the third antenna ANT3 may be disposed at an angle rotated by 90 degrees with respect to the fifth antenna ANT5. Also, the sixth antenna ANT6 may be disposed at an angle rotated by a predetermined angle with respect to the third antenna ANT3. In one example, the sixth antenna ANT6 may be disposed at an angle rotated by 90 degrees with respect to the third antenna ANT3.

In one implementation, the baseband processor 1400 may perform MIMO using the plurality of antennas 1100 in the antenna system 1000. The antenna system 1000 may include the transceiver circuit 1250 and the baseband processor 1400 as described above. For example, the baseband processor 1400 may perform 2×2 MIMO or 4×4 MIMO using some of the plurality of antennas 1100.

The baseband processor 1400 may control the transceiver circuit 1250 to perform 4×4 MIMO through the first antenna ANT1, the second antenna ANT2, the fifth antenna ANT5, and the sixth antenna ANT6. This can maintain distances between the antenna region and the RKE regions of the circuit board S1, thereby improving an isolation characteristic. The isolation characteristic can also be improved by using antennas that are disposed in the antenna region of the circuit board S1 in a rotated state by a predetermined angle. Meanwhile, the baseband processor 1400 may control the transceiver circuit 1250 to perform 2×2 dual sim dual active (DSDA) through the third antenna ANT3 and the fourth antenna ANT4.

In another implementation, the baseband processor 1400 may control the transceiver circuit 1250 to perform 4×4 MIMO through the first antenna ANT1, the second antenna ANT2, the third antenna ANT3, and the fourth antenna ANT4. This can maintain distances between the antenna region and the RKE regions of the circuit board S1, thereby improving an isolation characteristic. The isolation characteristic can also be improved by using antennas that are disposed in the antenna region of the circuit board S1 in a rotated state by a predetermined angle. Meanwhile, the baseband processor 1400 may control the transceiver circuit 1250 to perform 2×2 dual sim dual active (DSDA) through the fifth antenna ANT5 and the sixth antenna ANT6.

Therefore, when it is necessary to simultaneously receive information from various entities such as an adjacent vehicle, RSU, or base station for autonomous driving, etc., a broad reception can be allowed through MIMO. Accordingly, the vehicle can receive different information from various entities at the same time to improve a communication capacity. Therefore, the communication capacity of the vehicle can be improved through the MIMO without a bandwidth extension.

Alternatively, the vehicle may simultaneously receive the same information from various entities, so as to improve reliability for surrounding information and reduce latency. Accordingly, URLLC (Ultra Reliable Low Latency Communication) can be performed in the vehicle and the vehicle can operate as a URLLC UE. To this end, a base station performing scheduling may preferentially allocate a time slot for the vehicle operating as the URLLC UE. For this, some of specific time-frequency resources already allocated to other UEs may be punctured.

As described above, the plurality of antenna elements ANT1 to ANT6 implemented on the dielectric carrier may operate in the full band including the low band LB, the middle band MB, and the high band HB. Here, the low band LB may be referred to as a first frequency band and the middle band MB and the high band HB may be referred to as a second frequency band. Accordingly, the baseband processor 1400 can perform MIMO through some of the plurality of antenna elements ANT1 to ANT6 in the first frequency band. Also, the baseband processor 1400 can perform MIMO through some of the plurality of antenna elements ANT1 to ANT6 in the second frequency band. In this regard, the baseband processor 1400 can perform MIMO by using antenna elements that are sufficiently spaced apart from each other and disposed by being rotated at a predetermined angle. This can improve isolation between first and second signals within the same band.

Meanwhile, the first antenna ANT1 and the second antenna ANT2 of the antenna system 1000 may operate as radiators in the low band LB, which is the first frequency band. In this regard, the first to fourth antennas ANT1 to ANT4 may operate as radiators in the low band LB, which is the first frequency band. On the other hand, the first antenna ANT1, the second antenna ANT2, the fifth antenna ANT5, and the sixth antenna ANT6 may operate as radiators in the second frequency band, which includes the middle band MB and the high band HB.

Accordingly, the baseband processor 1400 may control the transceiver circuit 1250 to receive the second signal of the second frequency band while receiving the first signal of the first frequency band through one of the first to fourth antennas ANT1 to ANT4. In this case, the baseband processor 1400 can advantageously perform carrier aggregation (CA) through one antenna.

Alternatively, the baseband processor 1400 may control the transceiver circuit 1250 to receive the second signal of the second frequency band through one of the fifth antenna ANT5 and the sixth antenna ANT6 while receiving the first signal of the first frequency band through one of the first antenna ANT1 and the second antenna ANT2. In this case, there may be an advantage that each antenna can be designed to be optimized in a corresponding band and implemented to operate in the band.

Therefore, the baseband processor 1400 can perform carrier aggregation (CA) through a band in which the first frequency band and the second frequency band are coupled to each other. When it is necessary to receive a large amount of data for autonomous driving and the like, a broadband reception can be allowed through the CA.

Accordingly, eMBB (Enhanced Mobile Broad Band) communication can be performed in the vehicle and the vehicle can operate as an eMBB UE. To this end, a base station performing scheduling may preferentially allocate broadband frequency resources for the vehicle operating as the eMBB UE. For this purpose, CA may be performed on extra frequency bands except for frequency resources already allocated to other UEs.

It will be clearly understood by those skilled in the art that various changes and modifications to the aforementioned implementations related to the antenna system having the plurality of antennas, the vehicle having the antenna system, and the control operations thereof are made without departing from the idea and scope of the present disclosure. Therefore, it should be understood that such various changes and modifications to the implementations fall within the scope of the appended claims.

In the above, the antenna system mounted in the vehicle and the vehicle equipped with the antenna system have been described. Hereinafter, a description will be given of an antenna system mounted on a vehicle, a vehicle having the antenna system, and a wireless communication system including a base station. In this regard, FIG. 16 illustrates a block diagram of a wireless communication system that is applicable to methods proposed herein.

Figure 16:
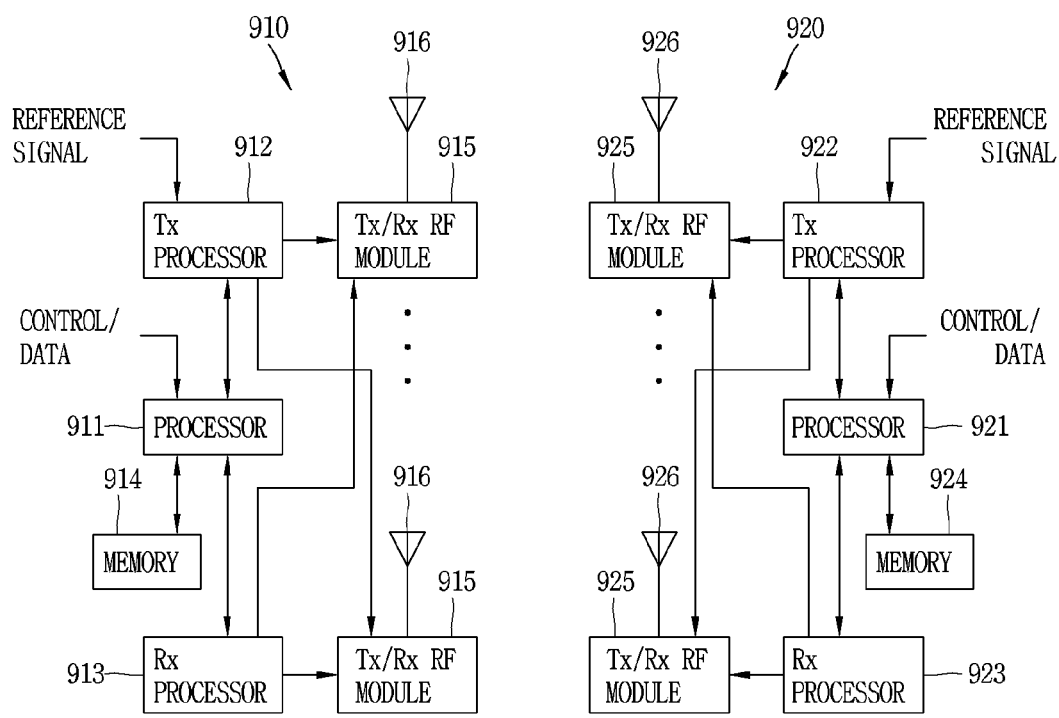
FIG. 16 is an exemplary block diagram of a wireless communication system to which methods proposed herein are applicable.

Referring to FIG. 16, the wireless communication system may include a first communication device 910 and/or a second communication device 920. The term 'A and/or B' may be interpreted as having the same meaning as 'including at least one of A or B'. The first communication device may denote a base station and the second communication device may denote a terminal (or the first communication device may denote the terminal or the vehicle and the second communication device may denote the base station).

The base station (BS) may be replaced with a term such as a fixed station, a Node B, an evolved-NodeB (eNB), a Next Generation NodeB (gNB), a base transceiver system (BTS), an access point (AP), or a general NB (gNB), a 5G system, a network, an AI system, a road side unit (RSU), robot or the like. In addition, the terminal may be fixed or have mobility, and may be replaced with a term, such as user equipment (UE), a mobile station (MS), a user terminal (UT), a mobile subscriber station (MSS), a subscriber station (SS), an advanced mobile station (AMS), a wireless terminal (WT), a machine-type communication (MTC) device, a machine-to-machine (M2M) device, a device-to-device (D2D) device, a vehicle, a robot, an AI module, or the like.

The first communication device and the second communication device each may include a processor 911, 921, a memory 914, 924, one or more Tx/Rx radio frequency modules 915, 925, a Tx processor 912, 922, an Rx processor 913, 923, and an antenna 916, 926. The processor may implement the aforementioned functions, processes, and/or methods. More specifically, in DL (communication from the first communication device to the second communication device), an upper layer packet from a core network may be provided to the processor 911. The processor may implement the function of an L2 layer. In DL, the processor may provide multiplexing between a logical channel and a transport channel and radio resource allocation to the second communication device 920, and may be responsible for signaling to the second communication device. The Tx processor 912 may implement various signal processing functions for an L1 layer (i.e., a physical layer). The signal processing function may facilitate forward error correction (FEC) in the second communication device, and include coding and interleaving. Encoded and modulated symbols may be divided into parallel streams. Each stream may be mapped to an OFDM subcarrier, multiplexed with a reference signal (RS) in a time and/or frequency domain, and combined together using an Inverse Fast Fourier Transform (IFFT) to create a physical channel carrying a time-domain OFDMA symbol stream. The OFDM stream may be spatially precoded to generate multiple spatial streams. Each spatial stream may be provided to the different antenna 916 via the separate Tx/Rx module (or transceiver) 915. Each Tx/Rx module may modulate an RF carrier into a spatial stream for transmission. The second communication device may receive a signal through the antenna 926 of each Tx/Rx module (or transceiver) 925. Each Tx/Rx module recovers information modulated onto an RF carrier, and provides it to the receive (RX) processor 923. The RX processor may implement various signal processing functions of the layer 1. The RX processor may perform spatial processing with respect to information to recover an arbitrary spatial stream destined for the second communication device. If multiple spatial streams are destined for the second communication device, they may be combined into a single OFDMA symbol stream by plural RX processors. The RX processor may transform the OFDMA symbol stream from a time domain to a frequency domain by using Fast Fourier Transform (FFT). A frequency domain signal may include an individual OFDMA symbol stream for each subcarrier of the OFDM signal. Symbols on each subcarrier and a reference signal may be recovered and demodulated by determining the most probable signal placement points transmitted by the first communication device. These soft decisions may be based on channel estimate values. The soft decisions may be decoded and deinterleaved to recover data and control signal originally transmitted by the first communication device on the physical channel. The corresponding data and control signal may then be provided to the processor 921.

UL (communication from the second communication device to the first communication device) may be processed in the first communication device 910 in a manner similar to that described with respect to the receiver function in the second communication device 920. Each Tx/Rx module 925 may receive a signal via the antenna 926. Each Tx/Rx module may provide the RF carrier and information to the RX processor 923. The processor 921 may be associated with the memory 924 that stores program code and data. The memory may be referred to as a computer-readable medium.

Meanwhile, when the first communication device is the vehicle, the second communication device may not be limited to the base station. In this regard, referring to FIG. 2A, the second communication device may be another vehicle, and V2V communication may be performed between the first communication device and the second communication device. On the other hand, the second communication device may be a pedestrian, and V2P communication may be performed between the first communication device and the second communication device. Also, the second communication device may be an RSU, and V2I communication may be performed between the first communication device and the second communication device. In addition, the second communication device may be an application server, and V2N communication may be performed between the first communication device and the second communication device.

In this regard, even when the second communication device is another vehicle, pedestrian, RSU, or application server, the base station may allocate resources for communication between the first communication device and the second communication device. Accordingly, a communication device configured to allocate resources for communication between the first communication device and the second communication device may be referred to as a third communication device. Meanwhile, the aforementioned series of communication procedures may also be performed among the first communication device to the third communication device.

So far, the antenna system mounted in the vehicle and the vehicle equipped with the antenna system have been described. Hereinafter, technical effects of an antenna system mounted on a vehicle and a vehicle equipped with the antenna system will be described.

According to one implementation, an antenna system having a metal cradle structure can provide a heat dissipation structure that prevents internal temperature from rising due to an external heat source.

According to one implementation, an antenna system having a metal cradle structure and a heat sink structure can provide a heat dissipation structure that prevents heat generated during an operation from affecting the performance of internal components.

According to one implementation, antenna performance and heat dissipation performance can be improved while maintaining a height of an antenna system mounted on a vehicle to be lower than or equal to a predetermined height.

According to one implementation, a structure for mounting an antenna system, which can operate in a broad frequency band, to a vehicle can be provided to support various communication systems by implementing a low band (LB) antenna and other antennas in one antenna module.

According to one implementation, the antenna system of the vehicle can implement MIMO and diversity operations using a plurality of antennas in specific bands.

According to one implementation, antennas that can operate in a broad frequency band can be implemented in an optimized arrangement structure, thereby improving antenna efficiency and securing isolation between antennas.

Further scope of applicability of the present disclosure will become apparent from the following detailed description. It should be understood, however, that the detailed description and specific examples, such as the preferred implementation of the invention, are given by way of illustration only, since various changes and modifications within the spirit and scope of the invention will be apparent to those skilled in the art.

In relation to the aforementioned present disclosure, design and operations of a plurality of antennas of an antenna system mounted in a vehicle and a configuration performing the control of those antennas can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller of the terminal. Therefore, the detailed description should not be limitedly construed in all of the aspects, and should be understood to be illustrative. Therefore, all changes and modifications that fall within the metes and bounds of the claims, or equivalents of such metes and bounds are therefore intended to be embraced by the appended claims.

The invention claimed is:

1. An antenna system mounted on a vehicle, the system comprising:
a metal cradle disposed inside a roof frame of the vehicle and configured to define a reception portion region, wherein the metal cradle is formed in a bent shape in a height direction and connected to a roof of the vehicle;
a circuit board on which antennas or circuit components are disposed; and
a heat sink disposed on a rear surface of the antenna system and configured to be fixed to the reception portion region,
wherein the heat sink includes a heat pipe formed through a fin and the heat pipe is formed in a bent shape to correspond to the bent shape of the metal cradle,
wherein the heat sink is attached to the metal cradle such that a rear surface of the heat sink contacts the metal cradle,
wherein the circuit board comprises:
a first substrate on which at least one antenna is disposed;
a second substrate disposed under the first substrate in parallel to the first substrate and a plurality of antennas operated in a 4G and 5G frequency band disposed on the second substrate;
a second heat sink disposed beneath the second substrate to surround the second substrate and extending up to a lower portion of the first substrate;
a first processor disposed on the heat sink and configured to process a signal from at least one of the plurality of antennas; and
a second processor disposed on the heat sink and configured to control the first processor,
wherein the second heat sink comprises:
a horizontal portion interfaced with components disposed on a rear surface of the second substrate through a thermal interface material (TIM); and
a first vertical portion extending vertically to the horizontal portion and configured to surround the components.

2. The antenna system of claim 1, wherein the heat sink comprises:
a body region having a predetermined length and width and having at least one aperture region; and
a plurality of module fixation portions integrally formed with the body region and configured to be fixed to the metal cradle by screws.

3. The antenna system of claim 2, wherein the plurality of module fixation portions operate as a thermal bridge and are located at different positions on front and rear ends of the body region.

4. The antenna system of claim 1, further comprising:
an insulation pad disposed on an upper portion of the antenna system and configured to insulate heat; and
a radome cover disposed on an upper portion of the insulating pad and configured to allow radio waves radiated from a plurality of antennas disposed inside the antenna system to pass therethrough.

5. The antenna system of claim 4, further comprising a light blocking film disposed on an upper portion of the radome cover to block light from being incident to the reception portion region inside the vehicle.

6. The antenna system of claim 1, wherein the second heat sink further comprises:
a first connection portion connected to the first vertical portion and disposed on a lower portion of the second substrate;
a second vertical portion extending vertically to the first connection portion to surround components disposed on a rear surface of the first substrate; and
a second connection portion connected to the second vertical portion and disposed on the lower portion of the first substrate.

7. The antenna system of claim 1 wherein heat generated by the first processor and heat generated by the second processor are emitted to a space below the second heat sink by the second heat sink that is in contact with the first substrate and the second substrate.

8. The antenna system of claim 1, further comprising a heat spread layer disposed above the second substrate, wherein the heat spread layer interfaces with the first processor through a heat interface material (TIM), and spreads heat generated from the second substrate by the second processor so as to prevent the heat from being transferred to the first processor.

9. The antenna system of claim 1, wherein the heat sink further comprises a cross fin having a plurality of metal plates disposed in parallel to one another.

10. The antenna system of claim 8, wherein the heat sink further comprises a vacuum chamber portion connected to the heat pipe and made of a metal plate having a predetermined width and length, and
wherein the vacuum chamber portion dissipates heat moved in one direction along the heat pipe to an external space of the metal cradle through a corresponding area.

11. The antenna system of claim 7, wherein the first processor controls an input power or gain of an amplifier in the first processor so as to reduce an RF output of the amplifier when internal temperature of the metal cradle is equal to or higher than a threshold value.

12. The antenna system of claim 7, wherein the second processor controls a fan module, which is disposed inside or outside the metal cradle, to blow air into the metal cradle when internal temperature of the metal cradle is equal to or higher than a threshold value.

13. A vehicle having an antenna system, the vehicle comprising:
- a metal cradle disposed inside a roof frame of the vehicle and configured to define a reception portion region, wherein the reception portion region is formed in a bent shape in a height direction and connected to a roof of the vehicle;
- an antenna system disposed in the reception portion region of the metal cradle and including a first substrate and a second substrate disposed under the first substrate;
- a first processor disposed on the first substrate or the second substrate and configured to process signals from a plurality of antennas;
- a second processor disposed on the second substrate and configured to control the first processor; and
- a heat sink disposed on a rear surface of the antenna system and configured to be fixed to the reception portion region,
- wherein the heat sink includes a heat pipe formed through a fin and the heat pipe is formed in a bent shape to correspond to the bent shape of the metal cradle, and
- wherein the heat sink is attached to the metal cradle such that a rear surface of the heat sink contacts the metal cradle,
- a second heat sink disposed beneath the second substrate to surround the second substrate, and extending up to a lower portion of the first substrate,
- wherein the second heat sink comprises:
- a horizontal portion interfaced with components disposed on a rear surface of the second substrate through a thermal interface material (TIM); and
- a first vertical portion extending vertically to the horizontal portion and configured to surround the components.

14. The vehicle of claim 13,
wherein the heat sink comprises:
- a body region having a predetermined length and width and having at least one aperture region; and
- a plurality of module fixation portions integrally formed with the body region and configured to be fixed to the metal cradle by screws,
- wherein the plurality of module fixation portions operate as a thermal bridge and are located at different positions on front and rear ends of the body region.

15. The vehicle of claim 13, further comprising:
- an insulation pad disposed on an upper portion of the antenna system and configured to insulate heat;
- a radome cover disposed on an upper portion of the insulating pad and configured to allow radio waves radiated from a plurality of antennas disposed inside the antenna system to pass therethrough; and
- a light blocking film disposed on an upper portion of the radome cover to block light from being incident to the reception portion region inside the vehicle.

16. The vehicle of claim 13,
wherein the second heat sink further comprises:
- a first connection portion connected to the first vertical portion and disposed on a lower portion of the second substrate;
- a second vertical portion extending vertically to the first connection portion to surround components disposed on a rear surface of the first substrate; and
- a second connection portion connected to the second vertical portion and disposed on the lower portion of the first substrate.

17. The vehicle of claim 13, further comprising a heat spread layer disposed above the second substrate,
- wherein the heat spread layer interfaces with the first processor through a heat interface material (TIM), and spreads heat generated from the second substrate by the second processor so as to prevent the heat from being transferred to the first processor,
- wherein the first processor controls the plurality of antennas to receive a first signal of a first frequency band from a first entity through a first antenna disposed on the first substrate or the second substrate, and a second signal of a second frequency band from a second entity through a second antenna disposed on the same plane as the first antenna, and performs communication with a base station as the first entity and V2V communication with another vehicle as the second entity.

18. The antenna system of claim 1, wherein the heat sink is configured to transfer heat for dissipation through the metal cradle.

19. The vehicle having the antenna system of claim 13, wherein the heat sink is configured to transfer heat for dissipation through the metal cradle.

* * * * *